United States Patent
Watanabe et al.

(10) Patent No.: US 11,094,722 B2
(45) Date of Patent: Aug. 17, 2021

(54) IMAGE SENSOR PACKAGE AND IMAGING APPARATUS

(71) Applicant: SONY CORPORATION, Tokyo (JP)

(72) Inventors: Tsuyoshi Watanabe, Kanagawa (JP); Yutaka Ootaki, Kanagawa (JP)

(73) Assignee: Sony Corporation, Tokyo (JP)

(*) Notice: Subject to any disclaimer, the term of this patent is extended or adjusted under 35 U.S.C. 154(b) by 0 days.

(21) Appl. No.: 16/072,221

(22) PCT Filed: Jan. 4, 2017

(86) PCT No.: PCT/JP2017/000051
§ 371 (c)(1),
(2) Date: Jul. 24, 2018

(87) PCT Pub. No.: WO2017/134972
PCT Pub. Date: Aug. 10, 2017

(65) Prior Publication Data
US 2019/0035836 A1    Jan. 31, 2019

(30) Foreign Application Priority Data

Feb. 1, 2016   (JP) .............................. JP2016-017178

(51) Int. Cl.
*H01L 27/14* (2006.01)
*H01L 23/02* (2006.01)
(Continued)

(52) U.S. Cl.
CPC .............. *H01L 27/14* (2013.01); *H01L 23/02* (2013.01); *H01L 24/85* (2013.01);
(Continued)

(58) Field of Classification Search
CPC ........... H01L 31/0203; H01L 27/14618; H01L 27/14636; H01L 27/14625
See application file for complete search history.

(56) References Cited

U.S. PATENT DOCUMENTS 5,223,746 A * 6/1993 Abe ................ H01L 23/057
257/678
5,477,081 A * 12/1995 Nagayoshi .............. H01L 23/04
257/678
(Continued)

FOREIGN PATENT DOCUMENTS

JP    H11-354769    12/1999
JP    2001-185657    7/2001
(Continued)

OTHER PUBLICATIONS

International Search Report prepared by the Japan Patent Office dated Mar. 6, 2017, for International Application No. PCT/JP2017/000051.

*Primary Examiner* — David A Zarneke
(74) *Attorney, Agent, or Firm* — Sheridan Ross P.C.

(57) ABSTRACT

An image sensor package according to an embodiment of the present technology includes: a solid-state image sensor; a transparent substrate; and a package substrate. The solid-state image sensor has a light-receiving surface including a light-reception unit and a first terminal unit, and a rear surface opposite to the light-receiving surface. The transparent substrate faces the light-receiving surface. The package substrate includes a frame portion, a second terminal unit, and a supporting body. The frame portion has a joint surface to be joined to the transparent substrate and includes a housing portion housing the solid-state image sensor. The second terminal unit is to be wire-bonded to the first terminal unit, the second terminal unit being provided in the frame portion. The supporting body is provided in a peripheral portion of the light-receiving surface or at a center portion of the rear surface and partially supports the light-receiving surface or the rear surface.

9 Claims, 14 Drawing Sheets

(51) Int. Cl.
*H01L 27/146* (2006.01)
*H04N 5/225* (2006.01)
*H04N 5/369* (2011.01)
*H01L 23/00* (2006.01)

(52) U.S. Cl.
CPC .. *H01L 27/14618* (2013.01); *H01L 27/14625* (2013.01); *H01L 27/14627* (2013.01); *H04N 5/2253* (2013.01); *H04N 5/2254* (2013.01); *H04N 5/369* (2013.01); *H01L 2224/48091* (2013.01); *H01L 2224/49175* (2013.01); *H01L 2224/8592* (2013.01); *H01L 2924/00014* (2013.01)

(56) References Cited

U.S. PATENT DOCUMENTS

| | | | |
|---|---|---|---|
| 5,952,714 A | 9/1999 | Sano et al. | |
| 6,147,389 A * | 11/2000 | Stern | H01L 27/14618 257/432 |
| 6,313,525 B1 * | 11/2001 | Sasano | H01L 27/14618 257/678 |
| 6,476,469 B2 * | 11/2002 | Hung | H01L 21/565 257/642 |
| 6,545,332 B2 * | 4/2003 | Huang | H01L 24/97 257/433 |
| 6,649,834 B1 * | 11/2003 | Hsieh | H01L 23/057 174/527 |
| 6,649,991 B1 * | 11/2003 | Chen | H01L 23/055 257/291 |
| 6,696,738 B1 * | 2/2004 | Tu | H01L 27/14618 257/432 |
| 6,707,125 B2 * | 3/2004 | Harazono | H01L 27/14618 257/434 |
| 6,713,876 B1 * | 3/2004 | Vittu | H01L 25/167 257/432 |
| 6,791,842 B2 * | 9/2004 | Hsin | H01L 31/0203 257/431 |
| 7,012,315 B1 * | 3/2006 | Campbell | H01L 23/04 257/433 |
| 7,154,053 B2 * | 12/2006 | Hsu | B81B 7/0067 174/564 |
| 7,250,663 B2 * | 7/2007 | Campbell | H01L 23/04 257/433 |
| 7,274,094 B2 * | 9/2007 | Boon | H01L 31/0203 257/433 |
| 7,408,205 B2 * | 8/2008 | Webster | H01L 27/14618 257/100 |
| 7,521,770 B2 * | 4/2009 | Wu | H01L 31/0203 257/379 |
| 7,554,184 B2 * | 6/2009 | Webster | H01L 27/14618 257/680 |
| 7,645,635 B2 * | 1/2010 | Wood | H01L 27/14618 438/113 |
| 7,816,750 B2 * | 10/2010 | Chua | H01L 24/48 257/433 |
| 7,948,694 B2 * | 5/2011 | Bogner | H01L 31/0203 359/819 |
| 8,110,755 B2 * | 2/2012 | Takayama | H01L 23/3121 174/521 |
| 10,068,818 B2 * | 9/2018 | Kawazu | H01L 23/043 |
| 10,319,766 B2 * | 6/2019 | Harazono | H01L 27/14625 |
| 2001/0017405 A1 | 8/2001 | Watanabe | |
| 2003/0128442 A1 * | 7/2003 | Tanaka | G02B 7/025 359/819 |
| 2003/0209787 A1 * | 11/2003 | Kondo | H01L 27/14618 257/673 |
| 2006/0255253 A1 * | 11/2006 | Hsiao | H01L 27/14618 250/239 |
| 2010/0091633 A1 * | 4/2010 | Furuyashikil | G11B 7/123 369/112.23 |
| 2013/0100343 A1 * | 4/2013 | Oh | H04N 5/2254 348/374 |
| 2013/0128109 A1 * | 5/2013 | Ichiki | H05K 1/0296 348/374 |
| 2018/0376041 A1 * | 12/2018 | Miura | H01L 27/14618 |
| 2020/0388640 A1 * | 12/2020 | Yu | H01L 27/14636 |

FOREIGN PATENT DOCUMENTS

| | | |
|---|---|---|
| JP | 2001-244280 | 9/2001 |
| JP | 2001-267541 | 9/2001 |
| JP | 2001-345392 | 12/2001 |
| JP | 2002-246574 | 8/2002 |
| JP | 2004-253590 | 2/2003 |
| JP | 2004-327917 | 11/2004 |
| WO | WO 97/05660 | 2/1997 |

\* cited by examiner

A

B

C

IMAGE SENSOR PACKAGE AND IMAGING APPARATUS

CROSS REFERENCE TO RELATED APPLICATIONS

This application is a national stage application under 35 U.S.C. 371 and claims the benefit of PCT Application No. PCT/JP2017/000051 having an international filing date of 4 Jan. 2017, which designated the United States, which PCT application claimed the benefit of Japanese Patent Application No. 2016-017178 filed 1 Feb. 2016, the entire disclosures of each of which are incorporated herein by reference.

TECHNICAL FIELD

The present technology relates to an image sensor package that houses a solid-state image sensor such as a CMOS image sensor, and an imaging apparatus including this.

BACKGROUND ART

An imaging package that houses an image sensor typically includes a package substrate and a solid-state image sensor mounted thereon, and as a structure in which the package substrate and the solid-state image sensor are wire-bonded.

Meanwhile, in recent years, in order to reduce the thickness of an imaging apparatus, it is desired to reduce the height of the package housing the solid-state image sensor. However, when the package substrate or the solid-state image sensor is made thin to reduce the height, in the above-mentioned structure, the light-receiving surface (imaging surface) of the solid-state image sensor warps due to differences in physical properties and thermal history among individual components such as the package substrate, the solid-state image sensor, and an adhesive material joining them, and deterioration of imaging performance cannot be avoided.

A joint structure in which the rear surface (surface opposite to the light-receiving surface) of the solid-state image sensor is opened without being fixed to the package substrate in order to suppress warpage of the light-receiving surface due to the reduction in height has been proposed (see Patent Literatures 1 to 4).

For example, Patent Literature 1 discloses a structure in which a printed circuit board having a frame opening for housing a solid-state image sensor, and a transparent substrate including an electrode terminal for electrically connecting the solid-state image sensor and the printed circuit board are provided, and the solid-state image sensor is bump-connected to the electrode terminal.

Patent Literature 2 discloses a structure in which a circuit substrate having a cavity for housing a semiconductor chip, and glass adhered to the upper surface of the semiconductor chip via a dam are provided, and the semiconductor chip and the circuit substrate are wire-bonded and joined by a sealing member filled in the cavity.

Patent Literature 3 discloses a structure in which a structure in which a substrate having a hole for housing an IC that is an imaging semiconductor, and an imaging lens fixed to an enclosure joined to the upper surface of the substrate are provided, and the IC and the substrate are wire-bonded and joined by resin filled in the hole.

Patent Literature 4 discloses a structure in which a base having an opening, and a transparent plate covering the opening are provided, and an image sensor is bump-connected to the base in such a way that the image sensor faces the transparent plate via the opening.

CITATION LIST

Patent Literature

Patent Literature 1: Japanese Patent Application Laid-open No. 2001-267541
Patent Literature 2: Japanese Patent Application Laid-open No. 2001-185657
Patent Literature 3: Japanese Patent Application Laid-open No. 2002-246574
Patent Literature 4: Japanese Patent Application Laid-open No. 2004-327917

DISCLOSURE OF INVENTION

Technical Problem

However, in the structures disclosed in Patent Literatures 1 and 4, since the solid-state image sensor and the package substrate are connected to each other by bumps, there is a problem that the number of steps required for assembly is increased as compared with the existing structure in which they are connected to each other by bonding wires. Further, in the structure disclosed in Patent Literature 2, since it is necessary to form ribs for placing glass thereon on the upper surface of the semiconductor chip, there is a problem that the number of steps required for assembly is increased. The structure disclosed in Patent Literature 3 has a problem that it is difficult to reduce the height of the package itself because the enclosure with the lens is fixed to the substrate, which results in an increase in the number of assembly steps and an increase in material costs due to an increase in the number of parts.

In view of the circumstances as described above, it is an object of the present technology to provide an image sensor package capable of suppressing warpage of the light-receiving surface, and an imaging apparatus including this.

Solution to Problem

An image sensor package according to an embodiment of the present technology includes a solid-state image sensor; a transparent substrate; and a package substrate.

The solid-state image sensor has a light-receiving surface and a rear surface, the light-receiving surface including a light-reception unit and a first terminal unit, the rear surface being opposite to the light-receiving surface.

The transparent substrate is placed facing the light-receiving surface.

The package substrate includes a frame portion, a second terminal unit, and a supporting body. The frame portion has a joint surface to be joined to the transparent substrate and includes a housing portion housing the solid-state image sensor. The second terminal unit is to be wire-bonded to the first terminal unit, the second terminal unit being provided in the frame portion. The supporting body is provided in a peripheral portion of the light-receiving surface or at a center portion of the rear surface and partially supports the light-receiving surface or the rear surface.

Since the image sensor package includes the supporting body that supports a part of the peripheral portion of the light-receiving surface or the rear surface of the solid-state image sensor, it is possible to suppress warpage of the light-receiving surface due to deformation of the package substrate or the like.

The supporting body may include a plurality of supporting portions each projecting toward the housing portion from the frame portion, the plurality of supporting portions each supporting the peripheral portion of the light-receiving surface.

Since the rear surface of the solid-state image sensor is opened, it is possible to suppress warpage of the light-receiving surface due to deformation of the package substrate or the like.

The frame portion may have a first terminal arrangement surface that supports the second terminal unit, and the plurality of supporting portions may each have a first joint surface constituting the joint surface, and a second joint surface to be joined to the peripheral portion of the light-receiving surface, the second joint surface being located between the first joint surface and the first terminal arrangement surface.

Accordingly, connection space for bonding wires is appropriately secured, and workability and reliability of wire bonding are prevented from being reduced.

The package substrate may further include a third terminal unit for surface mount, and a second terminal arrangement surface that is opposite to the first terminal arrangement surface and supports the third terminal unit.

The plurality of supporting portions may be provided at any position of the frame portion. Typically, the plurality of supporting portions are each provided on a pair of side portions of the frame portion, the pair of side portions being opposed to each other. Alternatively, the plurality of supporting portions are each provided at four corners of the frame portion.

The supporting body may include a plurality of supporting portions including a cured product layer formed of adhesive resin, the cured product layer being provided between four corners of the frame portion and the peripheral portion of the light-receiving surface.

The plurality of supporting portions may further include a plurality of base materials that are bridged between the four corners of the frame portion and the peripheral portion of the light-receiving surface, and covered by the cured product layer.

Accordingly, the supporting intensity of the solid-state image sensor with respect to the package substrate can be increased.

The package substrate may further include a bottom plate portion that is integrally provided with the frame portion and faces the rear surface, and the supporting body may include a cured product layer formed of adhesive resin, the cured product layer being provided between the center portion of the rear surface and the bottom plate portion.

Since the joint area between the rear surface of the solid-state image sensor and the bottom plate portion of the package substrate is limited, it is possible to suppress warpage of the light-receiving surface due to deformation of the package substrate or the like.

The bottom plate portion may include a through-hole portion that communicates with the center portion of the rear surface, and the supporting body may be provided between the through-hole portion and the center portion of the rear surface.

The constituent material of the frame portion is not particularly limited. For example, the frame portion may include a multilayer ceramic substrate, or the frame portion may include molded body formed of a plastic material.

An imaging apparatus according to an embodiment of the present technology includes a solid-state image sensor; a transparent substrate; a package substrate; and a lens holder.

The solid-state image sensor has a light-receiving surface and a rear surface, the light-receiving surface including a light-reception unit and a first terminal unit, the rear surface being opposite to the light-receiving surface.

The transparent substrate is placed facing the light-receiving surface.

The package substrate includes a frame portion, a second terminal unit, and a supporting body. The frame portion has a joint surface to be joined to the transparent substrate and includes a housing portion housing the solid-state image sensor. The second terminal unit is to be wire-bonded to the first terminal unit, the second terminal unit being provided in the frame portion. The supporting body is provided in a peripheral portion of the light-receiving surface or at a center portion of the rear surface and partially supports the light-receiving surface or the rear surface.

The lens holder includes a lens placed facing the light-receiving surface with the transparent substrate disposed therebetween.

Advantageous Effects of Invention

As described above, according to the present technology, it is possible to suppress warpage of the light-receiving surface due to deformation of the package substrate or the like.

It should be noted that the effect described here is not necessarily limitative and may be any effect described in the present disclosure.

MODE(S) FOR CARRYING OUT THE INVENTION

Hereinafter, embodiments of the present technology will be described with reference to the drawings.

First Embodiment

Figure 1:
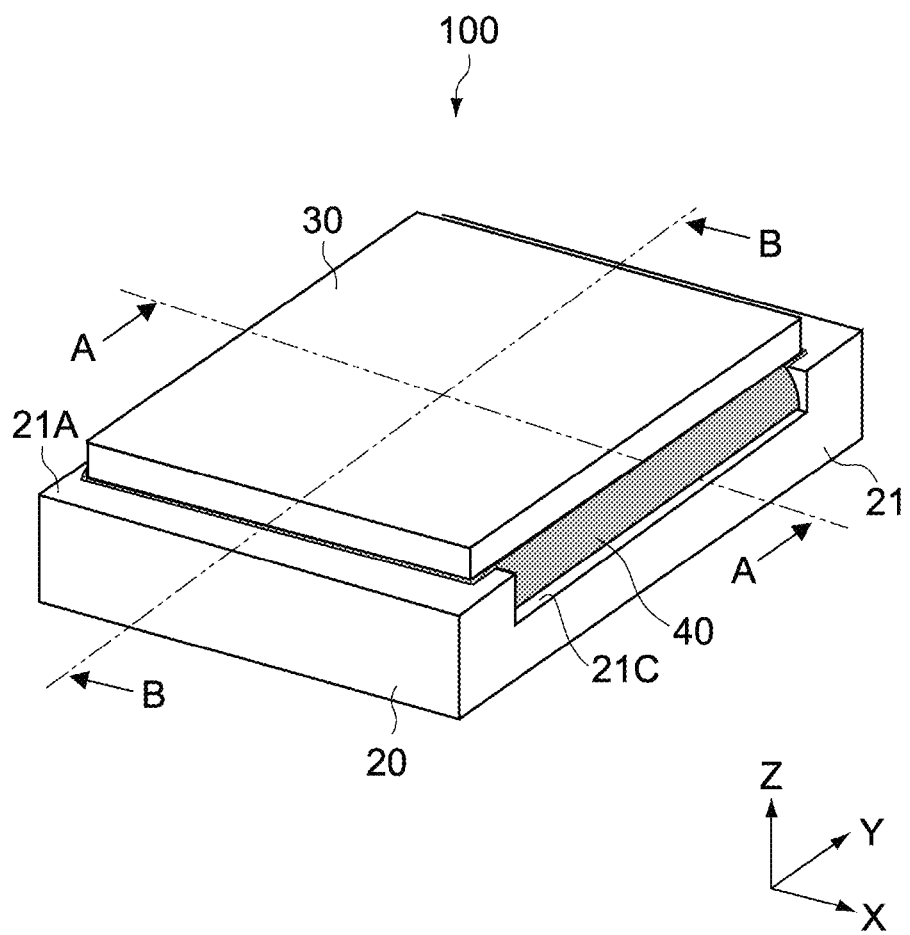
FIG. 1 is an overall perspective view of an image sensor package according to a first embodiment of the present technology.
Figure 2:
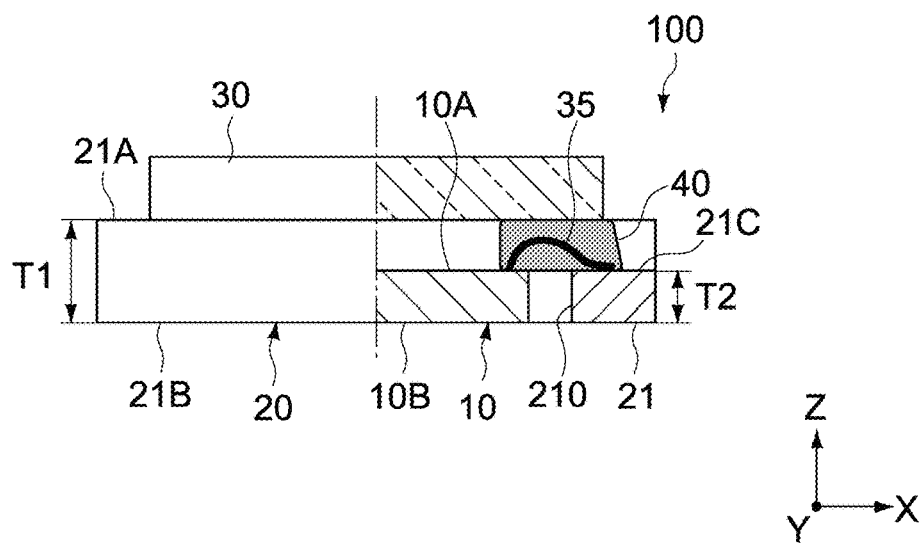
FIG. 2 is a partial cross-sectional view taken along the line A-A in FIG. 1.
Figure 3:
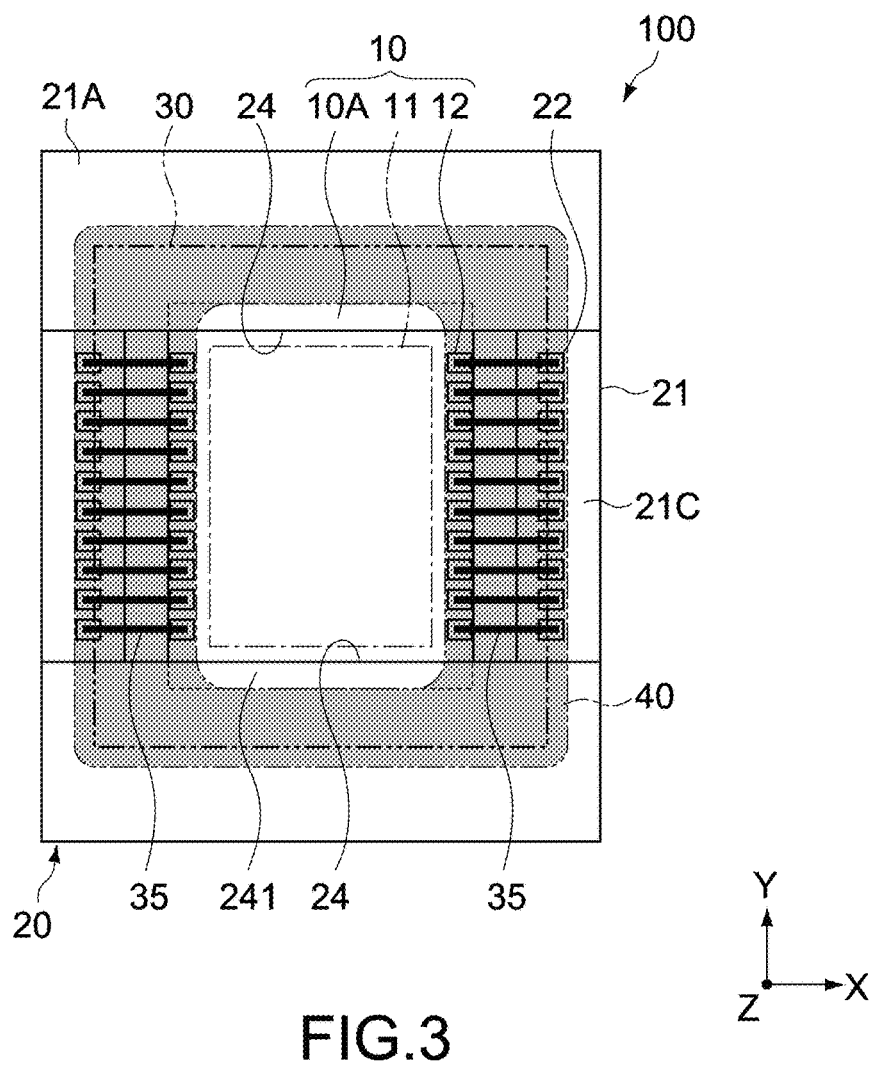
FIG. 3 is a partial transparent plan view of the image sensor package.
Figure 4:
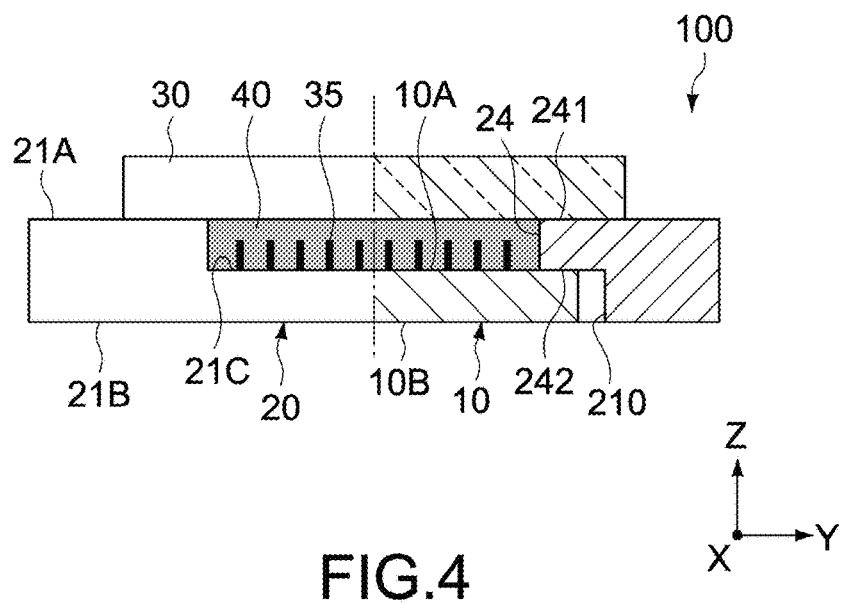
FIG. 4 is a partial cross-sectional view taken along the line B-B in FIG. 1.
Figure 5:
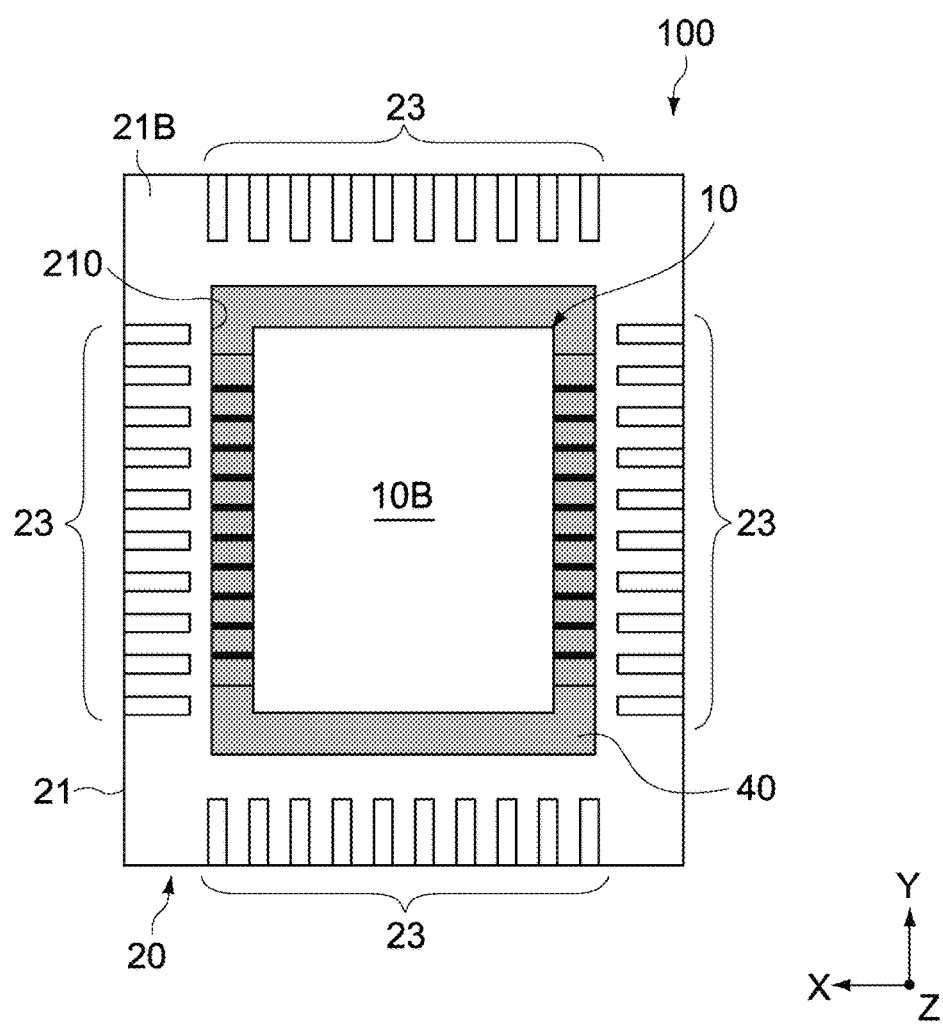
FIG. 5 is a bottom view of the image sensor package.

FIG. 1 is an overall perspective view of an image sensor package according to a first embodiment of the present technology. FIG. 2 is a partial cross-sectional view taken along the line A-A in FIG. 1. FIG. 3 is a partial transparent plan view of the image sensor package. FIG. 4 is a partial cross-sectional view taken along the line B-B in FIG. 1. FIG. 5 is a bottom view of the image sensor package.

Note that in the figures, an X-axis, a Y-axis, and a Z-axis represent triaxial directions perpendicular to each other, and the Z-axis corresponds to the thickness direction (height direction) of the image sensor package.

Whole Configuration of Image Sensor Package

An image sensor package 100 according to this embodiment includes a solid-state image sensor 10, a package substrate 20, and a transparent substrate 30.

The image sensor package 100 is used as an imaging part incorporated into a portable information terminal such as a smartphone, a game machine, and a tablet terminal in addition to an imaging apparatus such as a digital camera and a digital video camera.

Solid-State Image Sensor

The solid-state image sensor 10 includes an image sensor having a light-receiving surface (imaging surface) 10A. Typically, the solid-state image sensor 10 includes a CMOS (Complementary Metal Oxide Semiconductor) or CCD (Charge Coupled Device) sensor or the like.

The solid-state image sensor 10 has a rectangular shape having a pair of long sides in parallel with the Y-axis direction and a pair of short sides in parallel with the X-axis direction, and is supported by the package substrate 20 in such a way that the light-receiving surface 10A faces the transparent substrate 30.

As shown in FIG. 3, the light-receiving surface 10A includes a light-reception unit 11 and a plurality of terminal units 12 (first terminal units) arranged on the outside of the light-reception unit 11. The light-reception unit 11 is a substantially rectangular area provided at a substantially central portion of the light-receiving surface 10A, and the terminal units 12 are arranged along each of the long sides of the solid-state image sensor 10 at predetermined intervals. The solid-state image sensor 10 generates, by photoelectric conversion, charges depending on the amount of light received by the light-reception unit 11, and outputs them from the terminal units 12 as electric signals.

Package Substrate

The package substrate 20 includes a framed (picture-framed) frame portion 21 including a housing portion 210 housing the solid-state image sensor 10. As shown in FIG. 3, the frame portion 21 includes a rectangular annular multilayer ceramic substrate having long sides in parallel with the Y-axis direction and short sides in parallel with the X-axis direction. The frame portion 21 may be prepared by laminating, in the height direction (Z-axis direction), a ceramic layer having a predetermined shape, or by sequentially processing a predetermined area in the height direction after laminating a ceramic layer having the same shape.

The frame portion 21 has a first main surface 21A that supports the transparent substrate 30, and a second main surface 21B opposite thereto. The first main surface 21A constitutes a joint surface to be joined to the transparent substrate 30. The housing portion 210 includes a through-hole having a substantially rectangular shape in a plan view passing through between the first main surface 21A and the second main surface 21B. The light-reception unit 11 of the solid-state image sensor 10 faces the transparent substrate 30 via an opening of the first main surface 21A. The peripheral portion of the solid-state image sensor 10 faces the inner peripheral surface of an opening of the second main surface 21B with predetermined space therebetween (see FIG. 5).

The thickness of the frame portion 21 is larger than the thickness of the solid-state image sensor 10. In this embodiment, the second main surface 21B is located on the same plane as that of a rear surface (surface opposite to the light-receiving surface 10A) 10B of the solid-state image sensor 10 (see FIG. 2).

As shown in FIG. 3, the package substrate 20 includes a plurality of terminal units 22 (second terminal units) to be wire-bonded to the terminal units 12 of the solid-state image sensor 10, and the frame portion 21 includes a terminal arrangement surface 21C (first terminal arrangement surface) that support the terminal units 22. The terminal arrangement surface 21C is formed on the surface opposite to the second main surface 21B in each long side of the frame portion 21, and the terminal units 22 are arranged on each terminal arrangement surface 21C along the Y-axis direction at predetermined intervals.

The terminal arrangement surface 21C of the frame portion 21 is provided at a height position different from that of the first main surface 21A of the frame portion 21. As shown in FIG. 2, while the first main surface 21A is provided at a height T1 from the second main surface 21B, the terminal arrangement surface 21C is provided at a height T2, which is lower than the height T1, from the second main surface 21B. That is, the terminal arrangement surface 21C corresponds to a bottom surface of a recessed portion that is formed on the first main surface 21A of the frame portion 21 having the thickness corresponding to the height T1 and has a depth (T1-T2). The short side portion of the frame portion 21 and the long side portion of the frame portion 21 on which the terminal arrangement surface 21C is provided have different thicknesses. In this embodiment, the height T2 is set to be the same or substantially the same as the thickness of the solid-state image sensor 10.

The terminal units 22 on the terminal arrangement surface 21C face the terminal units 12 of the solid-state image sensor 10 in the X-axis direction in such a way that they individually correspond to each other, and are electrically connected to the respective terminal units 12 via bonding wires 35.

As shown in FIG. 5, on the second main surface 21B of the frame portion 21, a plurality of external terminal units 23 (second terminal units) for surface mount are provided. As described above, the second main surface 21B is located opposite to the terminal arrangement surface 21C, and configured as a terminal arrangement surface (second terminal arrangement surface) that supports the external terminal units 23.

The external terminal units 23 are arranged along the edge of each long side and the edge of each short side of the second main surface 21B at predetermined intervals. The frame portion 21 includes a multilayer wiring substrate including an internal wiring layer and an interlayer connection portion (via), and the external terminal units 23 are electrically connected to the respective terminal units 22 on the terminal arrangement surface 21C.

As shown in FIG. 3 and FIG. 4, the package substrate 20 further includes a plurality of supporting portions 24 as a supporting body that partially supports the peripheral portion of the light-receiving surface 10A of the solid-state image sensor 10 housed in the housing portion 210. The plurality of supporting portions 24 are located between the peripheral portion of the light-receiving surface 10A and the peripheral portion of the transparent substrate 30, and project toward the housing portion 210 from the frame portion 21 to support the peripheral portion of the light-receiving surface 10A.

In this embodiment, the plurality of supporting portions 24 are provided on a pair of short side portions opposed to each other in the long side direction of the frame portion 21. The plurality of supporting portions 24 are formed to have an eave shape on the first main surface 21A in such a way that the size (length of the long side along the Y-axis direction) of the opening of the housing portion 210 viewed from the first main surface 21A becomes smaller than the size (length of the long side along the Y-axis direction) of the opening of the housing portion 210 viewed from the second main surface 21B.

As shown in FIG. 4, the plurality of supporting portions 24 include a first joint surface 241 to be joined to the peripheral portion of the transparent substrate 30 and a second joint surface 242 to be joined to the peripheral portion of the light-receiving surface 10A of the solid-state image sensor 10.

The first joint surface 241 constitutes the first main surface 21A (joint surface) of the frame portion 21. That is, the first joint surface 241 is configured as the same plane as that of the first main surface 21A. The second joint surface 242 is located between the first joint surface 241 and the terminal arrangement surface 21C. In this embodiment, the second joint surface 242 is located on the same plane as that of the terminal arrangement surface 21C. Accordingly, the plurality of supporting portions 24 are configured to be connectable to the peripheral portion on the short side of the light-receiving surface 10A of the solid-state image sensor 10 housed in the housing portion 210.

The projection amount of each supporting portion 24 from the frame portion 21 to the housing portion 210 is not particularly limited as long as the light-receiving surface 10A and each supporting portion 24 overlap each other over a predetermined range in the Z-axis direction. The above-mentioned predetermined range is at least a part of the area from the peripheral portion on each short side of the light-receiving surface 10A to the light-reception unit 11. Since the supporting portions 24 are arranged facing the short side of the light-receiving surface 10A, the supporting portions 24 are capable of supporting the light-receiving surface 10A without interfering with the bonding wires 35. Further, since the projection amount of each supporting portion 24 is limited to the above-mentioned predetermined range, the area of the light-reception unit 11 is secured.

The thickness of each supporting portion 24 is the size corresponding to the difference between the height T1 and the height T2, and set to an appropriate size that can secure the rigidity capable of stably supporting the solid-state image sensor 10. Each supporting portion 24 is integrally formed with the frame portion 21. Specifically, each supporting portion 24 is configured as a part of the multilayer ceramic substrate constituting the package substrate 20.

The light-receiving surface 10A of the solid-state image sensor 10 and the second joint surface 242 of each supporting portion 24 are joined to each other via an adhesive agent (not shown). As the adhesive agent, for example, a non-glossy black thermosetting adhesive agent having a relatively small thermal expansion coefficient is adopted. Accordingly, it is possible to suppress peeling due to the thermal stress between the solid-state image sensor 10 and each supporting portion 24, and absorb object light that enters these joint portions to prevent stray light from occurring.

Transparent Substrate

The transparent substrate 30 is joined to the first main surface 21A (the first joint surface 241 of the supporting portion 24) of the frame portion 21 in a such a way that the transparent substrate 30 faces the light-receiving surface 10A of the solid-state image sensor 10 housed in the housing portion 210. The transparent substrate 30 is formed of an optical material transparent to visible light, such as glass and transparent plastic, and functions as a protective member for the light-receiving surface 10A.

As shown in FIG. 3, the transparent substrate 30 includes a plate-like part having a substantially rectangular shape in a plan view, and joined to the first joint surface 241 via a sealing layer 40. The sealing layer 40 is placed between the package substrate 20 and the transparent substrate 30, and seals the surroundings of the light-reception unit 11 including the terminal units 12 of the solid-state image sensor 10.

In this embodiment, as shown in FIG. 3, the sealing layer 40 is formed of, for example, a cured product of non-glossy black ultraviolet curable or thermosetting adhesive resin successively coated on the connection area (the terminal units 12 and 22, and the housing portion 210 between them) of the bonding wires 35 and the first joint surface 241 of each supporting portion 24 in such a way that the sealing layer 40 surrounds the light-reception unit 11. Note that the sealing layer 40 in each figure is indicated by a gray area.

Method of Producing Image Sensor Package

Next, a method of producing the image sensor package 100 configured as described above will be described.

Figure 6:
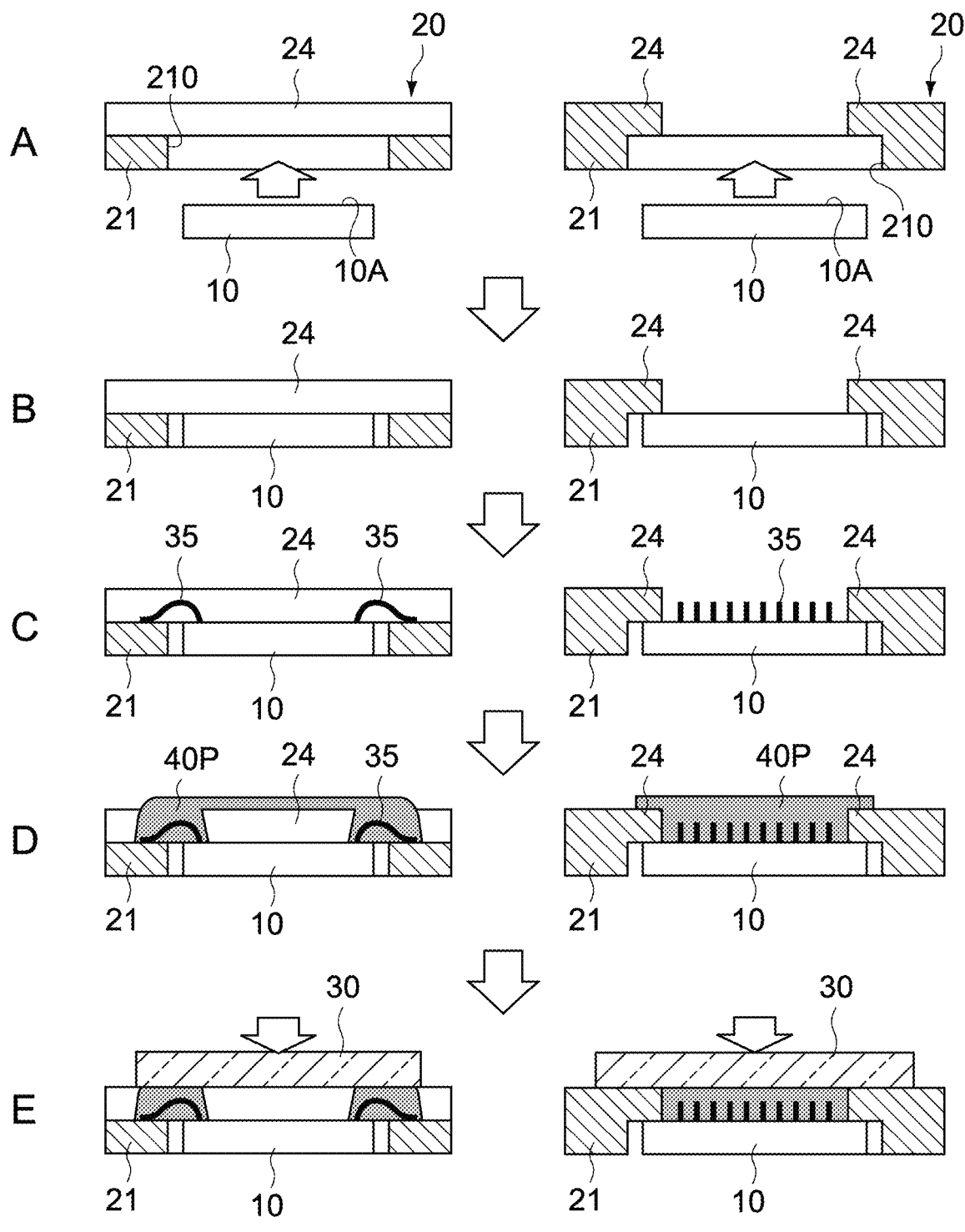
FIG. 6 is a schematic process cross-sectional view describing a method of producing the image sensor package, the left view being a cross-sectional view viewed from the direction of the line A-A in FIG. 1, the right view being a cross-sectional view viewed from the direction of the line B-B in FIG. 1.

Part A to Part E of FIG. 6 are each a schematic process cross-sectional view describing a method of producing the image sensor package 100, the left view being a cross-sectional view viewed from the direction of the line A-A in FIG. 1, the right view being a cross-sectional view viewed from the direction of the line B-B in FIG. 1.

First, the solid-state image sensor 10 is housed in the housing portion 210 of the frame portion 21 constituting the package substrate 20. The solid-state image sensor 10 is housed in the housing portion 210 in such a way that the light-receiving surface 10A of the solid-state image sensor 10 is directed to the plurality of supporting portions 24 that protrude toward the housing portion 210 from the frame portion (see Part A of FIG. 6).

Next, the peripheral portion of the light-receiving surface 10A of the solid-state image sensor 10 is joined to the plurality of supporting portions 24 (see Part B of FIG. 6, and FIG. 4). A non-glossy black adhesive agent having a small thermal expansion coefficient is coated on the second joint surface 242 (see FIG. 4) of the plurality of supporting portions 24 in advance, and the peripheral portion on the short sides of the light-receiving surface 10A is joined to the second joint surface 242 via the above-mentioned adhesive agent. Note that processing of curing the adhesive agent may be performed at this point or simultaneously with later processing of curing the sealing layer 40.

Subsequently, the terminal units 12 arranged on the light-receiving surface 10A of the solid-state image sensor 10 and the terminal units 22 arranged on the terminal arrangement surface 21C of the frame portion 21 are electrically connected to each other via the bonding wires 35 (see Part C of FIG. 6, and FIG. 3). Since the light-receiving surface 10A bonded to the second joint surface 242 of the plurality of supporting portions 24 is located at the same or substantially the same height as that of the terminal arrangement surface 21C of the package substrate 20, it is possible to properly and easily wire-bond the terminal units 12 and 22 with each other.

Next, an adhesive resin 40P before being cured that constitutes the sealing layer 40 and has tackiness is annularly coated on the connection area (the terminal units 12 and 22, and the housing portion 210 between them) of the bonding wires 35, and the first joint surface 241 of each supporting portion 24 (see Part D of FIG. 6, and FIG. 3). The adhesive resin 40P is formed of, for example, non-glossy black ultraviolet curable or thermosetting resin.

Then, after the transparent substrate 30 facing the light-receiving surface 10A with the adhesive resin 40P and the supporting portions 24 disposed therebetween is positioned on the frame portion 21, transparent substrate 30 is joined to the first joint surface 241 of the supporting portion 24 (see Part E of FIG. 6). After that, by performing ultraviolet irradiation treatment or heat treatment on the adhesive resin 40P, the sealing layer 40 sealing the light-reception unit 11 is formed. In this way, the image sensor package 100 according to this embodiment is prepared.

Imaging Apparatus

Figure 7:
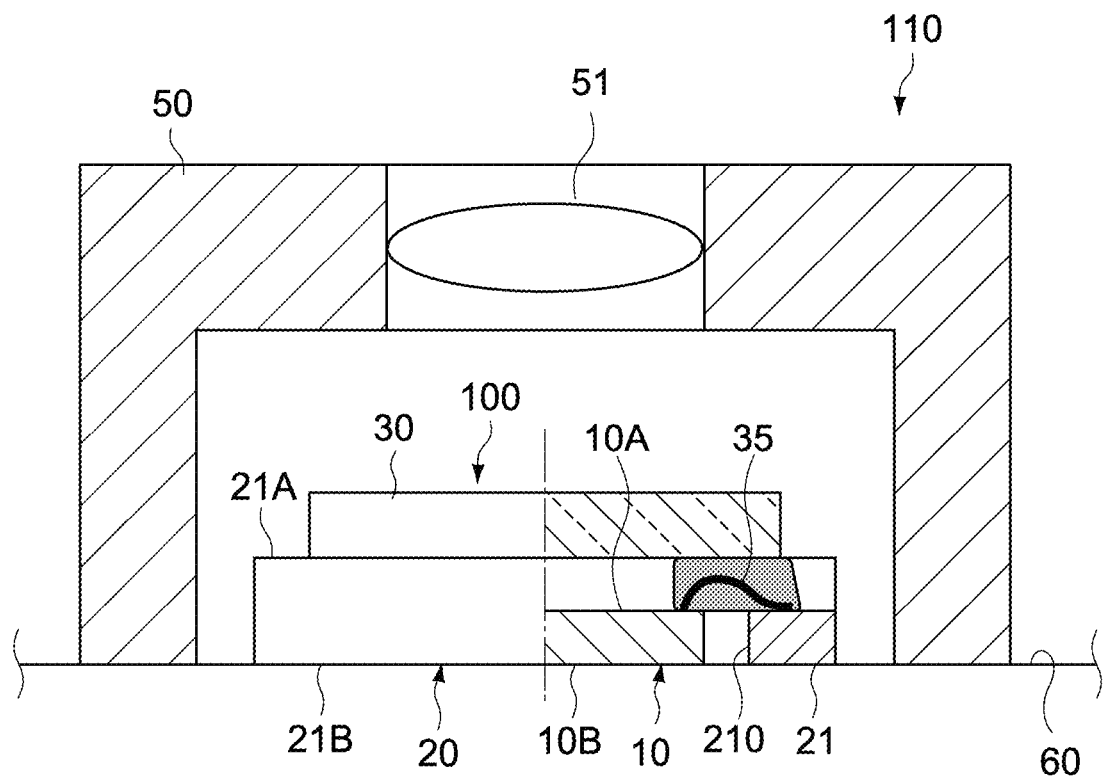
FIG. 7 is a schematic cross-sectional view of a main portion of an imaging apparatus including the image sensor package.

FIG. 7 is a schematic cross-sectional view of a main portion of an imaging apparatus including the image sensor package 100 according to this embodiment.

An illustrated imaging apparatus 110 includes the image sensor package 100 and a lens holder 50. The lens holder 50 includes a lens 51 placed facing the light-receiving surface 10A of the solid-state image sensor 10 with the transparent substrate 30 disposed therebetween. The image sensor package 100 is electrically connected to a mounting substrate 60 via the external terminal units 23 on the second main surface 21B. The lens holder 50 is fixed to the mounting substrate 60. The light-receiving surface 10A is located to be perpendicular to the optical axis of the lens 51, and aligned with the lens 51 so that an object light beam that enters via the lens 51 is applied to the light-reception unit 11.

The imaging apparatus 110 is incorporated into a lens barrel portion of a camera or a casing portion of a device. The lens holder 50 is not necessarily need to be fixed to the mounting substrate 60, and may be fixed to the lens barrel portion, the casing portion, or the like. The lens 51 is not limited to a single lens, and may be a lens unit including a plurality of lenses. The lens holder 50 may include a movable portion capable of causing the lens 51 to move in the optical axis direction. Further, instead of the image sensor package 100, image sensor packages 200 to 600 according to second to sixth embodiments to be described later may be applied.

Operation

In the image sensor package 100 according to this embodiment, the rear surface 10B of the solid-state image sensor 10 is not brought into contact with the package substrate 20 and is opened. Therefore, it is possible to reduce the height of the package depending on the thickness of the solid-state image sensor 10, and suppress warpage due to differences in thermal expansion coefficient between the solid-state image sensor 10, the package substrate 20, and the adhesive agent joining them, and the like. In particular, since the solid-state image sensor 10 is supported by the package substrate 20 via the plurality of supporting portions 24, the solid-state image sensor 10 is less likely to be affected by warpage or deformation of the package substrate 20 on the mounting substrate 60. Therefore, according to this embodiment, it is possible to realize reduction in size and height of the package while suppressing warpage of the light-receiving surface 10A.

Further, according to this embodiment, since a wire bonding method is adopted for electrical connection between the terminal units 12 of the solid-state image sensor 10 and the terminal units 22 of the package substrate 20, specific facilities and assembly materials are not necessary, and it is possible to reduce the number of processes as compared with the bump connection method, and improve the assembly property or productivity.

Further, in the image sensor package 100 according to this embodiment, the solid-state image sensor 10 and the transparent substrate 30 are fixed via the plurality of supporting portions 24 of the package substrate 20. Accordingly, it is possible to improve the assembly property while simplifying the structure. Further, it becomes easy to ensure the positioning accuracy of the light-receiving surface 10A with respect to the transparent substrate 30.

In addition, in this embodiment, since the rear surface 10B of the solid-state image sensor 10 is exposed from the second main surface 21B of the package substrate 20 (frame portion 21), a heat dissipation member such as a heat sink can be brought into direct contact with the rear surface of the solid-state image sensor 10. Accordingly, it is possible to secure a heat dissipation path of the solid-state image sensor 10 and suppress the temperature rise of the chip during operation.

Further, since the rear surface 10B of the solid-state image sensor 10 is housed in the housing portion 210 so as not to protrude from the second main surface 21B of the package substrate 20, the rear surface 10B of the solid-state image sensor 10 does not interfere with the mounting substrate 60 when the package substrate 20 is mounted on the mounting substrate 60. Accordingly, it is possible to stably mount the image sensor package 100 on the mounting substrate 60.

Second Embodiment

Figure 8:
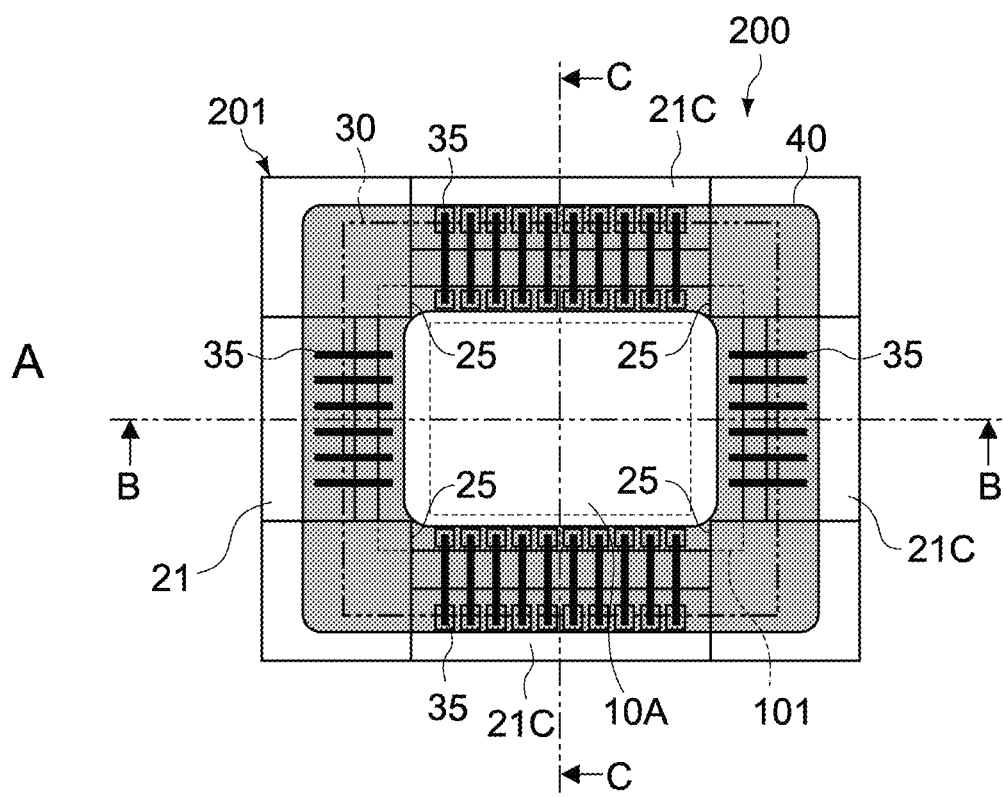
FIG. 8 shows an image sensor package according to a second embodiment of the present technology, Part A being a partial transparent plan view, Part B being a partial cross-sectional view taken along the line B-B in Part A, Part C being a partial cross-sectional view taken along the line C-C in Part A.
Figure 8:
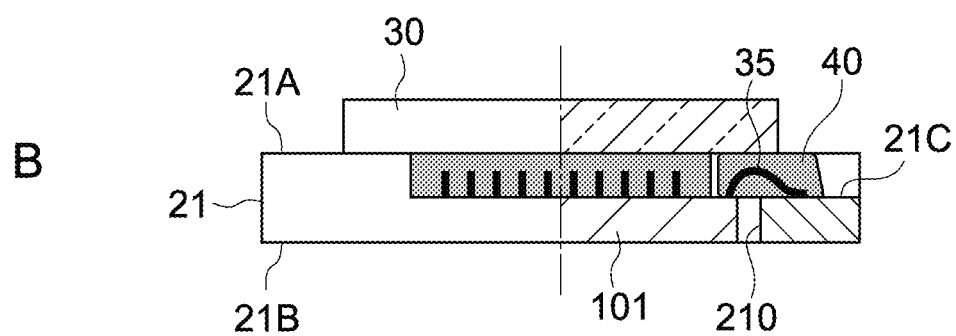
Figure 8:
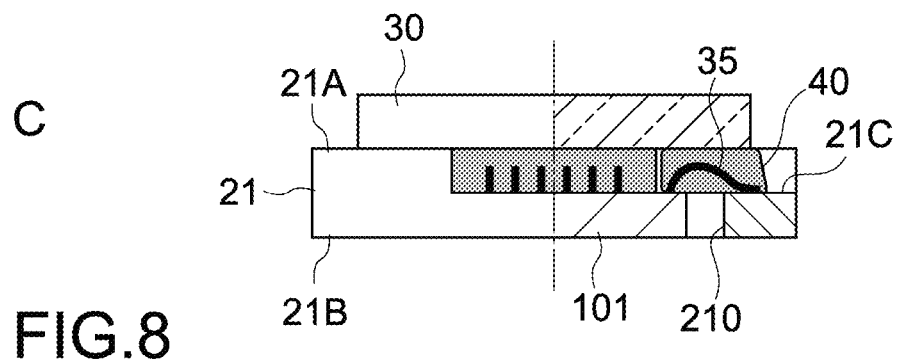

Part A to Part C of FIG. 8 each show an image sensor package according to a second embodiment of the present technology, Part A being a partial transparent plan view, Part B being a partial cross-sectional view taken along the line B-B in Part A, Part C being a partial cross-sectional view taken along the line C-C in Part A.

Hereinafter, configurations that are different from those according to the first embodiment will be mainly described. The configurations similar to those according to the first embodiment will be denoted by similar reference symbols and a description thereof will be omitted or simplified.

An image sensor package 200 according to this embodiment is common to the first embodiment in that the image sensor package 200 includes a solid-state image sensor 101, a package substrate 201, and the transparent substrate 30. Meanwhile, this embodiment is different from the first embodiment in that the solid-state image sensor 101 includes terminal units (first terminal units) on the four side portions of the light-receiving surface 10A, and the package substrate 201 includes, on the four corners thereof, four supporting portions 25 that support the solid-state image sensor 101 and the transparent substrate 30.

As shown in Part A of FIG. 8, at the four corners of the frame portion 21 in the package substrate 201, the supporting portions 25 that partially support the light-receiving surface 10A of the rectangular solid-state image sensor 101 housed in the housing portion 210 are provided. As shown in the figure, each supporting portion 25 has a rectangular planar shape, projects toward the housing portion 210 from the four corners of the frame portion 21, and is located between the peripheral portion (four corners) of the light-receiving surface 10A and the peripheral portion of the transparent substrate 30.

Each supporting portion 25 has a first joint surface that supports the light-receiving surface 10A of the solid-state image sensor 101 and a second joint surface that supports the transparent substrate 30 similarly to the first embodiment. The above-mentioned first joint surface is joined to the transparent substrate 30 via the sealing layer 40. The above-mentioned second joint surface is a surface of a tip portion of each supporting portions 25, which faces the light-receiving surface 10A, and joined to the light-receiving surface 10A via an adhesive layer (not shown).

The frame portion 21 includes a plurality of terminal arrangement surfaces 21C that support terminal units (second terminal units) to be connected (wire-bonded) to the terminal units 12 of the solid-state image sensor 101 via the bonding wires 35. These terminal arrangement surfaces 21C are provided on the side portions of the frame portion 21 corresponding to portions between the four supporting portions 25.

The frame portion 21 includes a multilayer ceramic substrate similarly to the first embodiment. The frame portion 21 may be prepared by laminating a ceramic layer having a predetermined shape, or by sequentially processing a predetermined area in the height direction after laminating a ceramic layer having the same shape. In Part B and Part C of FIG. 8, each terminal arrangement surface 21C corresponds to a bottom surface of a recessed portion that is formed on the upper surface (first main surface 21A) of each side portion of the frame portion 21.

The image sensor package 200 configured as described above according to this embodiment can also obtain similar operation and effect as those of the above-mentioned first embodiment. Further, the plurality of supporting portions 25 does not necessarily need to be provided on all four corners of the frame portion 21, and may be provided at three corners or two corners that are diagonal to each other.

Third Embodiment

Figure 9:
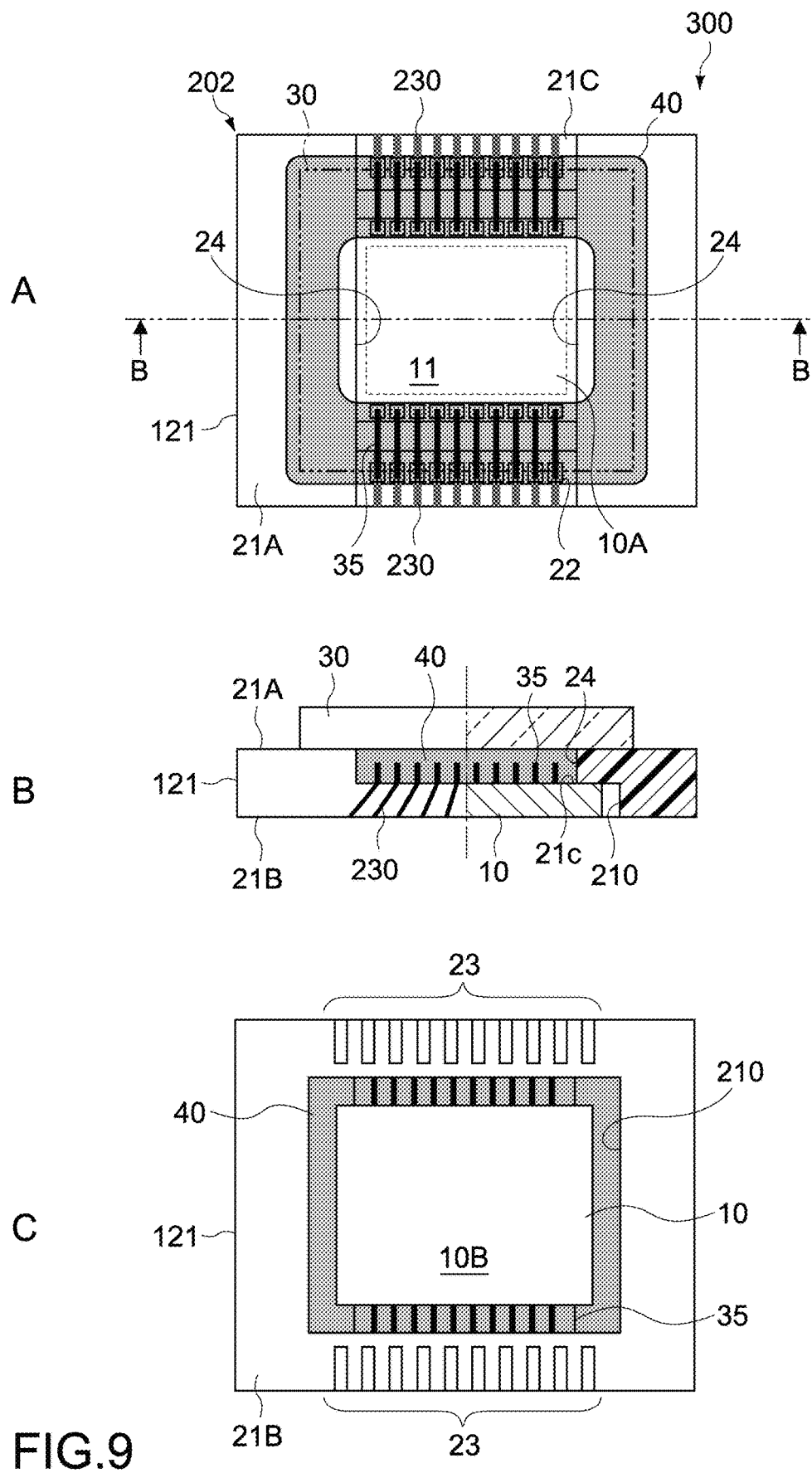
FIG. 9 shows an image sensor package according to a third embodiment of the present technology, Part A being a partial transparent plan view, Part B being a partial cross-sectional view taken along the line B-B in Part A, Part C being a bottom view.

Part A to Part C of FIG. 9 each show an image sensor package according to a third embodiment of the present technology, Part A being a partial transparent plan view, Part B being a partial cross-sectional view taken along the line B-B in Part A, Part C being a bottom view.

Hereinafter, configurations that are different from those according to the first embodiment will be mainly described. The configurations similar to those according to the first embodiment will be denoted by similar reference symbols and a description thereof will be omitted or simplified.

An image sensor package 300 according to this embodiment is common to the first embodiment in that the image sensor package 300 includes the solid-state image sensor 10, a package substrate 202, and the transparent substrate 30. However, this embodiment is different from the first embodiment in that a frame portion 121 of the package substrate 202 includes a molded body of a plastic material.

The resin material constituting the frame portion 121 is not particularly limited. For example, an appropriate plastic material such as an acrylic-type, epoxy-type, and phenol-type plastic materials is used, and particularly, a plastic material having a small thermal expansion coefficient is favorable. The frame portion 121 is configured similarly to that in the first embodiment except for the material thereof, and the plurality of supporting portions 24 partially joined to the peripheral portion (side portion) of the light-receiving surface 10A of the solid-state image sensor 10 are formed of a plastic material integrally molded with the frame portion 121.

Further, the package substrate 202 according to this embodiment includes wiring patterns 230 that electrically connect the terminal units 22 arranged on the terminal arrangement surface 21C and the external terminal units 23 arranged on the second main surface 21B. The wiring patterns 230 each include a metal layer such as copper plating formed on the side peripheral portion on the long side of the frame portion 121.

The image sensor package 300 configured as described above according to this embodiment can also obtain similar operation and effect as those of the above-mentioned first embodiment. Note that also in the second embodiment, similarly, the frame portion 21 and the plurality of supporting portions 25 may each be formed of a plastic material.

Fourth Embodiment

Figure 10:
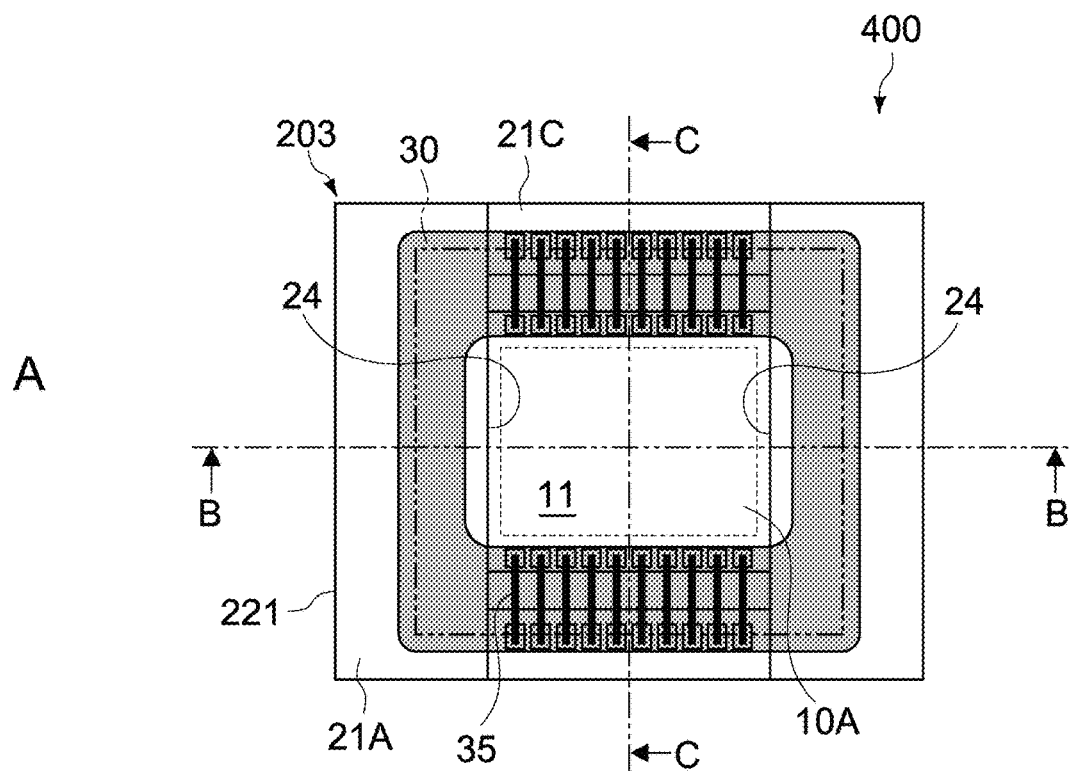
FIG. 10 shows an image sensor package according to a fourth embodiment of the present technology, Part A being a partial transparent plan view, Part B being a partial cross-sectional view taken along the line B-B in Part A, Part C being a partial cross-sectional view taken along the line C-C in Part A.
Figure 10:
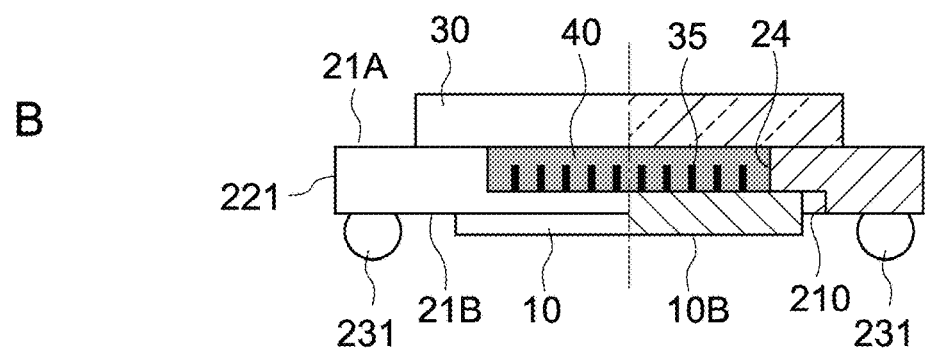
Figure 10:
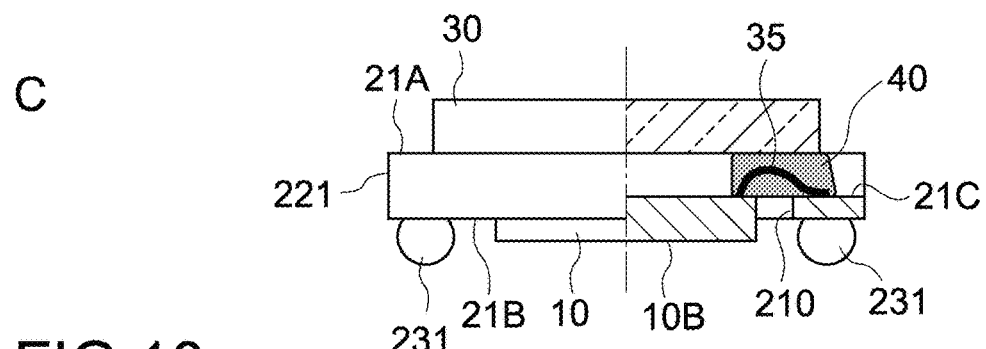

Part A to Part C of FIG. 10 each show an image sensor package according to a fourth embodiment of the present technology, Part A being a partial transparent plan view, Part B being a partial cross-sectional view taken along the line B-B in Part A, Part C being a partial cross-sectional view taken along the line C-C in Part A.

Hereinafter, configurations that are different from those according to the first embodiment will be mainly described. The configurations similar to those according to the first embodiment will be denoted by similar reference symbols and a description thereof will be omitted or simplified.

An image sensor package 400 according to this embodiment is common to the first embodiment in that the image sensor package 400 includes the solid-state image sensor 10, a package substrate 203, and the transparent substrate 30. However, this embodiment is different from the first embodiment in that the depth of the housing portion 210 of a frame portion 221 of the package substrate 203 is smaller than the thickness of the solid-state image sensor 10 and the external terminal units include projection electrodes 231.

As shown in Part B and Part C of FIG. 10, since the housing portion 210 of the frame portion 221 is formed with a depth dimension smaller than the thickness dimension of the solid-state image sensor 10, the rear surface 10B of the solid-state image sensor 10 housed in the housing portion 210 projects from the second main surface 21B of the frame portion 221. Therefore, in this embodiment, the external terminal units provided on the second main surface 21B of the frame portion 221 include the projection electrodes 231 that project to the outside (lower side in Part B and Part C of FIG. 10) relative to the rear surface 10B of the solid-state image sensor 10. Accordingly, it is possible to surface-mount the image sensor package 400 on a mounting substrate (not shown).

The projection electrodes 231 typically include bump electrodes such as ball bumps, plated bumps, and stud bumps. Note that the frame portion 221 may include a multilayer ceramic substrate or a molded body of a plastic material. Further, the above-mentioned configuration can be similarly applied to the package substrate 202 according to the second embodiment.

Fifth Embodiment

Figure 11:
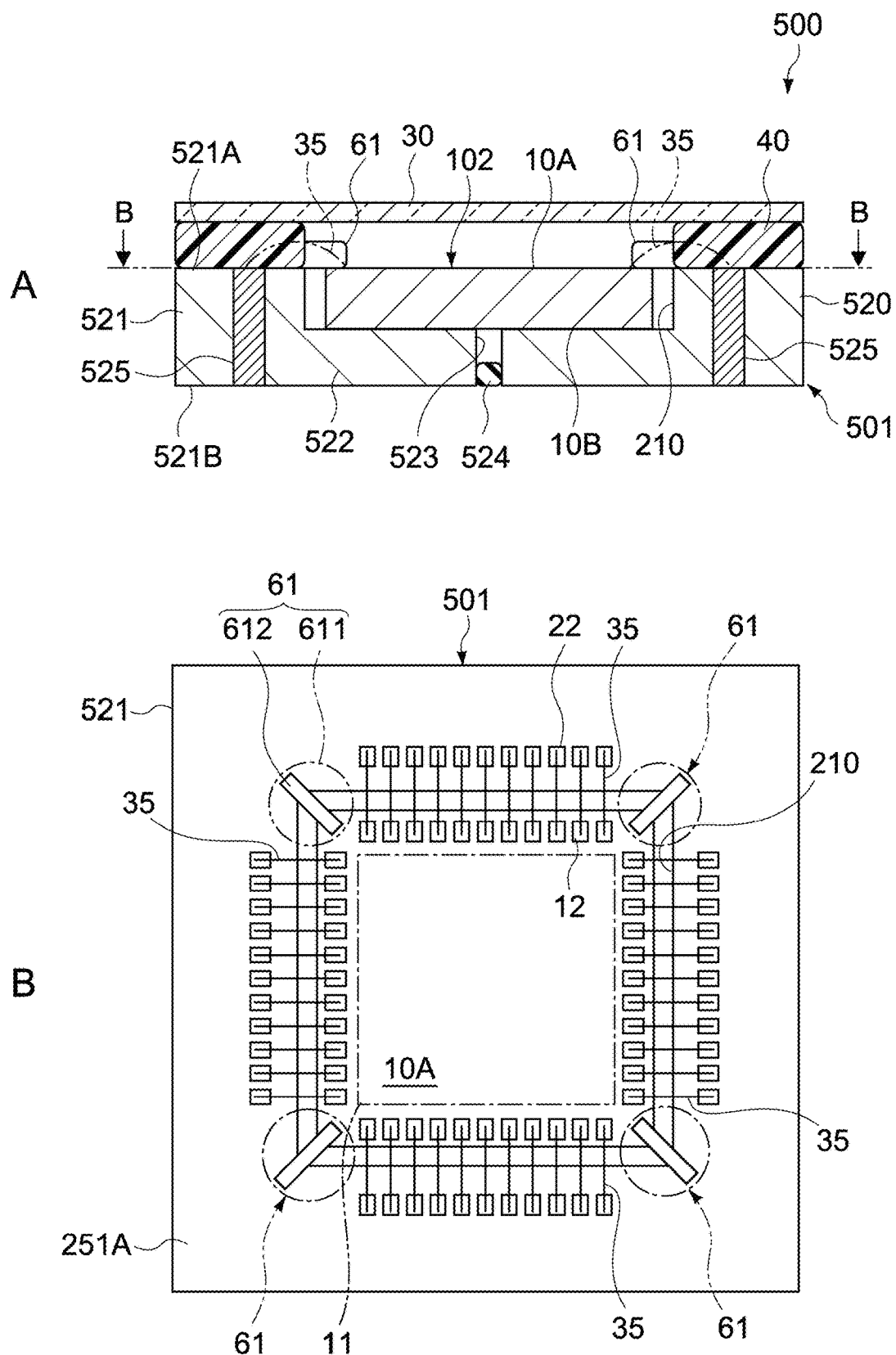
FIG. 11 shows an image sensor package according to a fifth embodiment of the present technology, Part A being a schematic cross-sectional side view, Part B being a cross-sectional view taken along the line B-B in Part A.

Part A and Part B of FIG. 11 each show an image sensor package according to a fifth embodiment of the present technology, Part A being a schematic cross-sectional side view, Part B being a cross-sectional view taken along the line B-B in Part A.

Hereinafter, configurations that are different from those according to the first embodiment will be mainly described. The configurations similar to those according to the first embodiment will be denoted by similar reference symbols and a description thereof will be omitted or simplified.

An image sensor package 500 according to this embodiment is common to the first embodiment in that the image sensor package 500 includes a solid-state image sensor 102, a package substrate 501, and the transparent substrate 30. However, the configuration of the package substrate 501 is different from that in the first embodiment. In this embodiment, the package substrate 501 includes a main body portion 520, the terminal units 22, and a plurality of supporting portions 61.

The main body portion 520 includes a rectangular frame portion 521 and a bottom plate portion 522.

The frame portion 521 includes a joint surface 521A to be joined to the transparent substrate 30 via the sealing layer 40 and the rectangular housing portion 210 housing the solid-state image sensor 102. The light-receiving surface 10A of the solid-state image sensor 102 includes the light-reception unit 11 and the terminal units 12 arranged on four sides of the peripheral portion thereof. On the joint surface 251A of the frame portion 521, the terminal units 22 to be connected to the terminal units 12 of the solid-state image sensor 102 via the bonding wires 35 are arranged.

The bottom plate portion 522 is integrally provided on a bottom surface 521B of the frame portion 521 so as to form the bottom surface of the housing portion 210, and faces the rear surface 10B of the solid-state image sensor 10. On the bottom plate portion 522, a through-hole portion 523 that communicates with the center portion of the rear surface of the solid-state image sensor 10 is formed, and this through-hole portion 523 is sealed with a plug material 524. For the plug material 524, for example, highly viscous resin, a solder resist, a sheet film, or the like is used. As will be described later, the through-hole portion 523 is used as a suction hole for adsorbing the solid-state image sensor 10 to the bottom plate portion 522 in producing the image sensor package 500.

The main body portion 520 including the frame portion 521 and the bottom plate portion 522 is formed of a multilayer ceramic material, and includes an interlayer connection portion 525 that electrically connects the joint surface 521A of the frame portion 521 and the bottom surface 521B. Note that the main body portion 520 including the frame portion 521 and the bottom plate portion 522 may include a molded body of a plastic material.

The plurality of supporting portions 61 are provided on the peripheral portion of the light-receiving surface 10A of the solid-state image sensor 10, and configured as supporting bodies that partially support the light-receiving surface 10A. In this embodiment, the plurality of supporting portions 61 include cured product layers 611 formed of adhesive resin provided between the four corners of the frame portion 521 and the peripheral portion (four corners) of the light-receiving surface 10A. The cured product layers 611 are each formed in a circular plate shape or dome shape integrating the frame portion 521 and the solid-state image sensor 10 via the housing portion 210, and maintain the solid-state image sensor 10 in a predetermined posture the housing portion 210. Accordingly, the solid-state image sensor 10 is held in the main body portion 520 with predetermined positioning accuracy.

The above-mentioned adhesive resin is not particularly limited as long as it is capable of stably supporting the light-receiving surface 10A, and resin for sealing such as epoxy resin is typically used. For improving the strength, fillers such as glass fibers and inorganic particles may be contained in the resin. The method of forming the cured product layers 611 is not particularly limited, and a transfer molding method using a mold, a potting method using a syringe, and the like can be applied.

Further, the plurality of supporting portions 61 may each include a composite of the cured product layer 611 formed of adhesive resin and a base material 612. The base material 612 is bridged between the four corners of the frame portion 521 and the peripheral portion of the light-receiving surface 10A, and covered by the cured product layers 611. Accordingly, the mechanical strength of each supporting portion 61 is improved, and the solid-state image sensor 10 can be stably held by the main body portion 520. Note that the rear surface 10B of the solid-state image sensor 10 may be in contact with the bottom plate portion 522, or does not necessarily need to be in contact with the bottom plate portion 522.

The material, shape, and the like of the base material 612 are not particularly limited, and for example, a plate material, a bar material, or the like formed of a metal material, a resin material, a ceramic material or the like is used.

The image sensor package 500 configured as described above according to this embodiment can also obtain similar operation and effect as those of the above-mentioned first embodiment. According to this embodiment, since the rear surface 10B of the solid-state image sensor 10 is not constrained by the bottom plate portion 522 of the package substrate 501, it is possible to suppress warpage of the light-receiving surface 10A of the solid-state image sensor 10 due to warpage, deformation, or the like of the main body portion 520.

Figure 12:
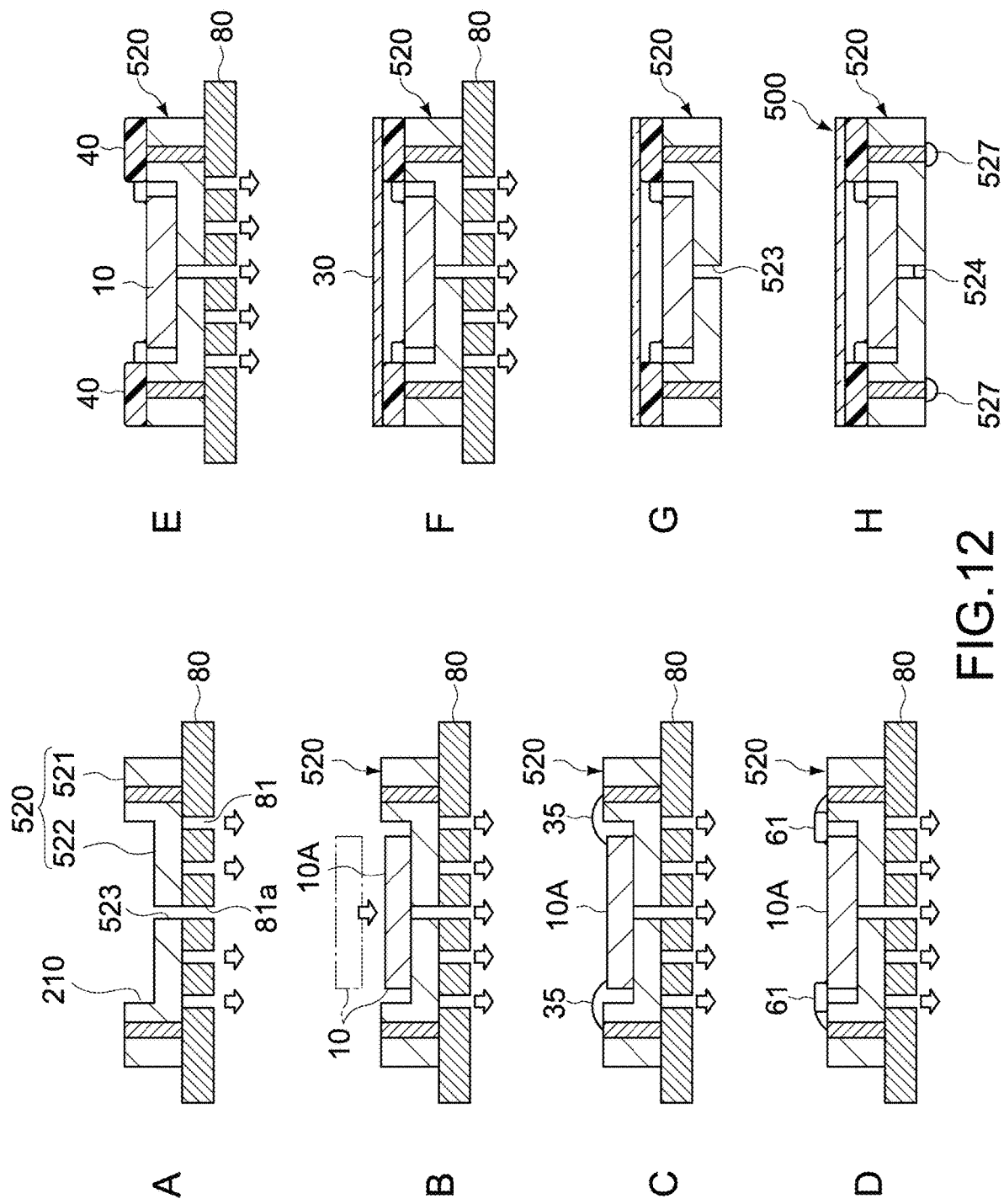
FIG. 12 is a schematic cross-sectional view of main processes describing a method of producing the image sensor package.

FIG. 12 is a schematic cross-sectional view of main processes describing a method of producing the image sensor package 500.

First, the main body portion 520 of the package substrate 501 prepared in advance is placed on an adsorption stage 80 having a plurality of suction holes 81 with the bottom plate portion 522 directed downward (Part A of FIG. 12). At this time, the main body portion 520 is placed on the adsorption stage 80 in such a way that the through-hole portion 523 provided in the bottom plate portion 522 is aligned with a predetermined suction hole 81a. Each of the suction holes 81 and 81a communicate with an air inlet of a vacuum pump (not shown), and the main body portion 520 is held on the adsorption stage 80 via the suction holes 81.

Subsequently, the solid-state image sensor 10 is housed in the housing portion 210 of the main body portion 520 held by the adsorption stage 80 with the light-receiving surface 10A directed upward (Part B of FIG. 12). The solid-state image sensor 10 is vacuum-adsorbed on the bottom plate portion 522 via the through-hole portion 523 provided in the bottom plate portion 522 and the suction holes 81a. Accordingly, the solid-state image sensor 10 is held in the housing portion 210 with predetermined positioning accuracy.

Figure 13:
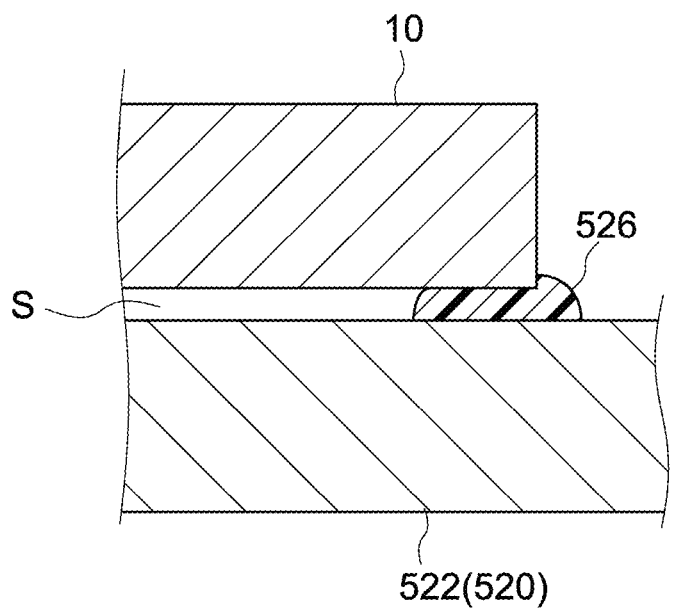
FIG. 13 is a main portion cross-sectional view describing a production process of the image sensor package.

At this time, as shown in FIG. 13, a sealing material 526 for forming a hermetically sealed space S the bottom plate portion 522 and the rear surface 10B of the solid-state image sensor 10 may be provided on the bottom plate portion 522 so as to extend along the peripheral edge of the solid-state image sensor 10. Accordingly, it is possible to secure a stable adsorption operation of the solid-state image sensor 10 on the bottom plate portion 522.

Subsequently, the terminal units on the light-receiving surface 10A and the terminal units on the main body portion 520 (frame portion 521) are electrically connected to each other via the bonding wires 35 (Part C of FIG. 12).

Next, the plurality of supporting portions 61 that couple the four corners of the light-receiving surface 10A of the solid-state image sensor 10 to the frame portion 521 of the main body portion 520 are provided (Part D of FIG. 12). The plurality of supporting portions 61 includes the cured product layers 611 formed of adhesive resin as described above (see Part B of FIG. 11). In this embodiment, liquid resin having a relatively high viscosity is applied to the four corners of the light-receiving surface 10A by a potting method or the like, and then cured. In the case where the viscosity of the above-mentioned liquid resin is low or the strength of the supporting portion 61 is increased, for example, the base material 612 may be bridged between the light-receiving surface 10A and the main body portion 520 before applying the liquid resin (see Part B of FIG. 11).

Next, the transparent substrate 30 is bonded to the frame portion 521 of the main body portion 520 via the sealing layer 40 (Part E and Part F of FIG. 12). After that, the adsorption operation of the main body portion 520 by the adsorption stage 80 is released, and the plug material 524 is filled in the through-hole portion 523 (Part G and Part H of FIG. 12). The image sensor package 500 according to this embodiment is produced in this way. Note that as necessary, bumps 527 are provided on the external terminal units on the bottom surface of the main body portion 520.

Sixth Embodiment

Figure 14:
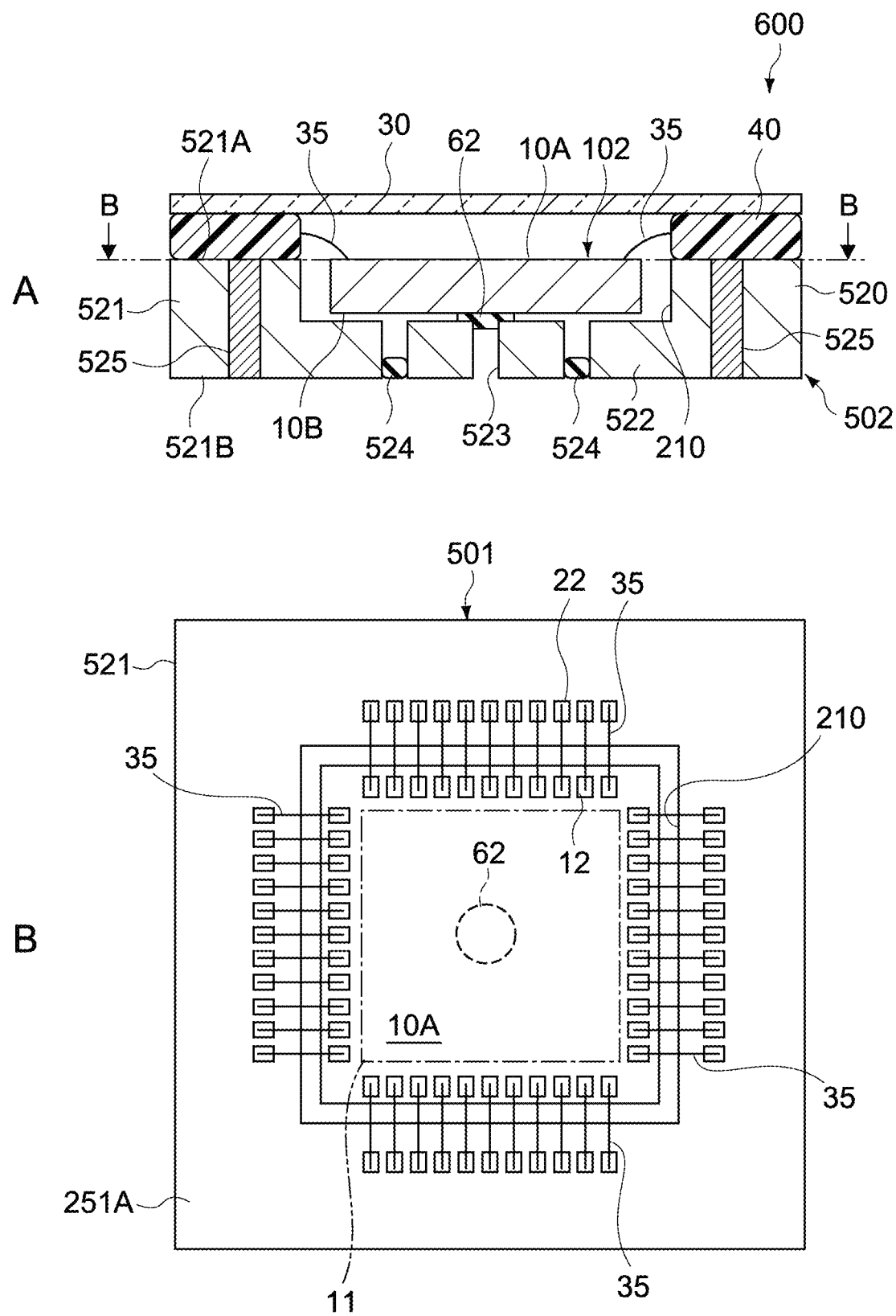
FIG. 14 shows an image sensor package according to a sixth embodiment of the present technology, Part A being a schematic cross-sectional side view, Part B being a cross-sectional view taken along the line B-B in Part A.

Part A and Part B of FIG. 14 each show an image sensor package according to a sixth embodiment of the present technology, Part A being a schematic cross-sectional side view, Part B being a cross-sectional view taken along the line B-B in Part A.

Hereinafter, configurations that are different from those according to the fifth embodiment will be mainly described. The configurations similar to those according to the fifth embodiment will be denoted by similar reference symbols and a description thereof will be omitted or simplified.

An image sensor package 600 according to this embodiment is common to the first embodiment in that the image sensor package 600 includes the solid-state image sensor 102, a package substrate 502, and the transparent substrate 30. However, the configuration of the package substrate 502 is different from that in the fifth embodiment. In this embodiment, the package substrate 502 includes the main body portion 520, the terminal units 22, and a supporting body 62.

The main body portion 520 includes the rectangular frame portion 521 and the bottom plate portion 522 similarly to the fifth embodiment. In this embodiment, in the bottom plate portion 522, a plurality of through-hole portion 523 that communicate with the rear surface of the solid-state image sensor 10 are formed, and these through-hole portions 523 are sealed with plug materials 524. The through-hole portions 523 are each used as a suction hole for adsorbing the solid-state image sensor 10 to the bottom plate portion 522 in producing the image sensor package 600.

Figure 15:
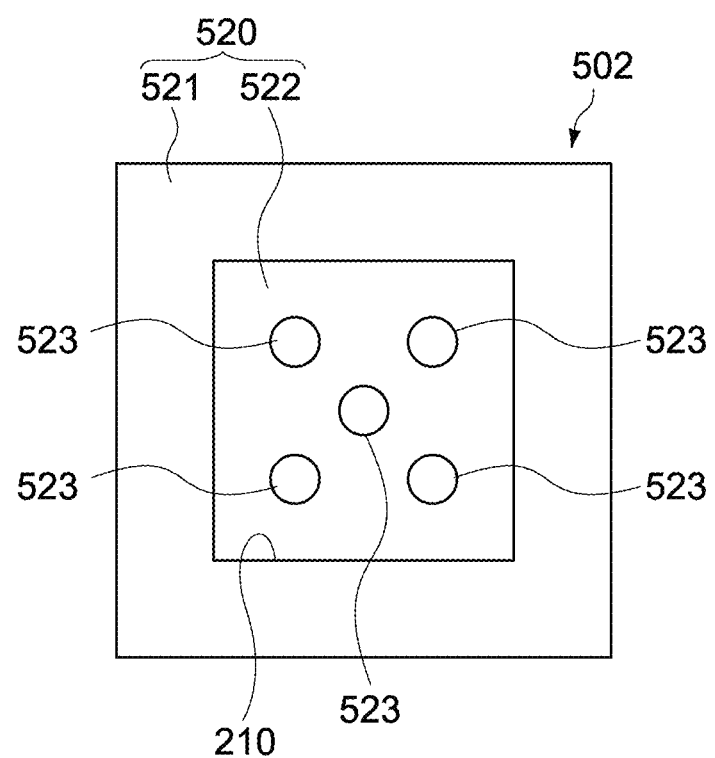
FIG. 15 is a schematic plan view showing a main body portion of a package substrate of the image sensor package.

FIG. 15 is a schematic plan view of the main body portion 520. As shown in FIG. 15, the through-hole portions 523 are provided in the center portion of the bottom plate portion 522 and four positions around the center portion. It goes without saying that the number of through-hole portions 523 is not limited to this example.

The supporting body 62 is provided at the center portion of the rear surface 10B of the solid-state image sensor 10, and partially supports the rear surface 10B. In this embodiment, the supporting body 62 includes a cured product layer formed of adhesive resin provided between the center portion of the rear surface 10B and the bottom plate portion 522. Accordingly, the solid-state image sensor 10 is held in the main body portion 520 with predetermined positioning accuracy.

The supporting body 62 is provided between the through-hole portion 523 located at the center of the bottom plate portion 522 and the center portion of the rear surface 10B. The supporting body 62 covers the opening on the side of the housing portion 210 of the through-hole portion 523 located at the center portion of the bottom plate portion 522. Accordingly, the supporting body 62 also functions as a plug material that seals the through-hole portion 523 located at the center portion.

The supporting body 62 supports a predetermine area including the center portion of the rear surface 10B of the solid-state image sensor 10. The predetermined area is not particularly limited, and is, for example, not more than 10% of the area of the rear surface 10B. Also the planar shape of the supporting body 62 is not particularly limited. Typically, the planar shape of the supporting body 62 is a circular shape as shown in Part B of FIG. 14.

The above-mentioned adhesive resin is not particularly limited as long as it is capable of stably supporting the rear surface 10B of the solid-state image sensor 10, and resin for die bonding such as epoxy resin and silicone resin is typically used. For improving the strength, fillers such as glass fibers and inorganic particles may be contained in the resin. The method of forming the supporting body 62 is not particularly limited. Typically, liquid resin before curing is applied to the rear surface 10B of the solid-state image sensor 10 via the through-hole portion 523, and then cured.

The image sensor package 600 configured as described above according to this embodiment can also obtain similar operation and effect as those of the above-mentioned first embodiment. According to this embodiment, since the joint area between the rear surface 10B of the solid-state image sensor 10 and the bottom plate portion 522 of the package substrate 501 is limited to the center portion of the rear surface 10B, it is possible to suppress warpage of the light-receiving surface 10A of the solid-state image sensor 10 due to warpage, deformation, or the like of the main body portion 520.

Figure 16:
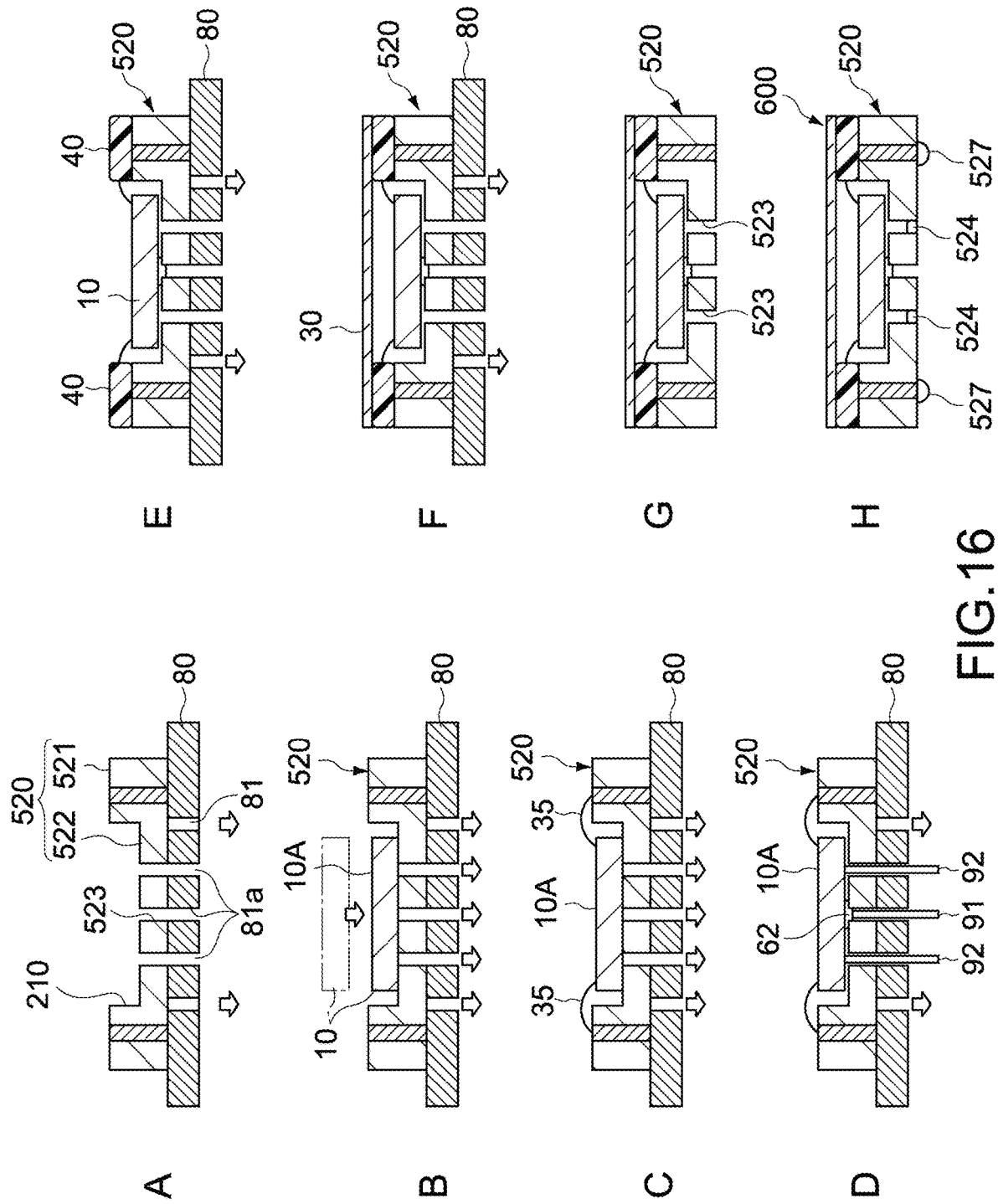
FIG. 16 is a schematic cross-sectional view of main processes describing a method of producing the image sensor package.

FIG. 16 is a schematic cross-sectional view of main processes describing a method of producing the image sensor package 600.

First, the main body portion 520 of the package substrate 502 prepared in advance is placed on an adsorption stage 80 having the plurality of suction holes 81 with the bottom plate portion 522 directed downward (Part A of FIG. 16). At this time, the main body portion 520 is placed on the adsorption stage 80 in such a way that the plurality of through-hole portions 523 provided in the bottom plate portion 522 are aligned with predetermined suction holes 81a. Each of the suction holes 81 and 81a communicate with an air inlet of a vacuum pump (not shown), and the main body portion 520 is held on the adsorption stage 80 via the suction holes 81.

Subsequently, the solid-state image sensor 10 is housed in the housing portion 210 of the main body portion 520 held by the adsorption stage 80 with the light-receiving surface 10A directed upward (Part B of FIG. 16). The solid-state image sensor 10 is vacuum-adsorbed on the bottom plate portion 522 via the through-hole portions 523 provided in the bottom plate portion 522 and the suction holes 81a. Accordingly, the solid-state image sensor 10 is held in the housing portion 210 with predetermined positioning accuracy.

Note that also in this example, similarly, a sealing material for forming hermetically sealed space the bottom plate portion 522 and the rear surface 10B of the solid-state image sensor 10 may be provided on the bottom plate portion 522 so as to extend along the peripheral edge of the solid-state image sensor 10 (see FIG. 13).

Subsequently, the terminal units on the light-receiving surface 10A and the terminal units on the main body portion 520 (frame portion 521) are electrically connected to each other via the bonding wires 35 (Part C of FIG. 16).

Next, a syringe 91 and lift pins 92 are respectively inserted in the through-hole portion 523 formed in the center portion of the bottom plate portion 522 and other through-hole portions 523 via the adsorption stage 80 (Part D of FIG. 16). Then, by raising each lift pins 92 by a predetermined distance, the rear surface of the solid-state image sensor 10 is lifted in the housing portion 210. In this state, adhesive resin forming the supporting body 62 is injected from the syringe 91 (Part D of FIG. 16).

Next, the syringe 91 and the lift pins 92 are pulled out from the main body portion 520, and the transparent substrate 30 is bonded to the frame portion 521 via the sealing layer 40 (Part E and Part F of FIG. 16). After that, the adsorption operation of the main body portion 520 by the adsorption stage 80 is released, and plug materials 524 are filled in the through-hole portions 523 (Part G and Part H of FIG. 12). The image sensor package 600 according to this embodiment is produced in this way. Note that as necessary, the bumps 527 are provided on the external terminal units on the bottom surface of the main body portion 520.

Although embodiments of the present technology have been described above, the present technology is not limited to only the above-mentioned embodiments, and it goes without saying that various modifications can be made.

It should be noted that the present technology may take the following configurations.

(1) An image sensor package, including:
a solid-state image sensor that has a light-receiving surface and a rear surface, the light-receiving surface including a light-reception unit and a first terminal unit, the rear surface being opposite to the light-receiving surface;
a transparent substrate placed facing the light-receiving surface; and
a package substrate including a frame portion that has a joint surface to be joined to the transparent substrate and includes a housing portion housing the solid-state image sensor, a second terminal unit to be wire-bonded to the first terminal unit, the second terminal unit being provided in the frame portion, and a supporting body that is provided in a peripheral portion of the light-receiving surface or at a center portion of the rear surface and partially supports the light-receiving surface or the rear surface.

(2) The image sensor package according to (1) above, in which
the supporting body includes a plurality of supporting portions each projecting toward the housing portion from the frame portion, the plurality of supporting portions each supporting the peripheral portion of the light-receiving surface.

(3) The image sensor package according to (2) above, in which
the frame portion has a first terminal arrangement surface that supports the second terminal unit, and
the plurality of supporting portions each have a first joint surface constituting the joint surface, and a second joint surface to be joined to the peripheral portion of the light-receiving surface, the second joint surface being located between the first joint surface and the first terminal arrangement surface.

(4) The image sensor package according to (3) above, in which
the package substrate further includes a third terminal unit for surface mount, and a second terminal arrangement surface that is opposite to the first terminal arrangement surface and supports the third terminal unit.

(5) The image sensor package according to any one of (2) to (4) above, in which
the plurality of supporting portions are each provided on a pair of side portions of the frame portion, the pair of side portions being opposed to each other.

(6) The image sensor package according to any one of (2) to (4) above, in which
the plurality of supporting portions are each provided at four corners of the frame portion.

(7) The image sensor package according to any one of (1) to (6), in which
the package substrate further includes a bottom plate portion that is integrally provided with the frame portion and faces the rear surface, and
the supporting body includes a plurality of supporting portions including a cured product layer formed of adhesive resin, the cured product layer being provided between four corners of the frame portion and the peripheral portion of the light-receiving surface.

(8) The image sensor package according to (7) above, in which the plurality of supporting portions further include a plurality of base materials that are bridged between the four corners of the frame portion and the peripheral portion of the light-receiving surface, and covered by the cured product layer.

(9) The image sensor package according to (1) above, in which the package substrate further includes a bottom plate portion that is integrally provided with the frame portion and faces the rear surface, and the supporting body includes a cured product layer formed of adhesive resin, the cured product layer being provided between the center portion of the rear surface and the bottom plate portion.

(10) The image sensor package according to (9) above, in which the bottom plate portion includes a through-hole portion that communicates with the center portion of the rear surface, and the supporting body is provided between the through-hole portion and the center portion of the rear surface.

(11) The image sensor package according to any one of (1) to (10) above, in which the frame portion includes a multilayer ceramic substrate.

(12) The image sensor package according to any one of (1) to (10) above, in which the frame portion includes a molded body formed of a plastic material.

(13) An imaging apparatus, including:

a solid-state image sensor that has a light-receiving surface and a rear surface, the light-receiving surface including a light-reception unit and a first terminal unit, the rear surface being opposite to the light-receiving surface;

a transparent substrate placed facing the light-receiving surface;

a package substrate including a frame portion that has a joint surface to be joined to the transparent substrate and includes a housing portion housing the solid-state image sensor, a second terminal unit to be wire-bonded to the first terminal unit, the second terminal unit being provided in the frame portion, and a supporting body that is provided in a peripheral portion of the light-receiving surface or at a center portion of the rear surface and partially supports the light-receiving surface or the rear surface; and a lens holder including a lens placed facing the light-receiving surface with the transparent substrate disposed therebetween.

REFERENCE SIGNS LIST 10, 101, 102 solid-state image sensor
10A light-receiving surface
10B rear surface
11 light-reception unit
12, 22 terminal unit
20, 201, 202, 203, 501, 502 package substrate
21, 221, 521 frame portion
23 external terminal unit
24, 25, 61, 62 supporting portion (supporting body)
50 lens holder
100, 200, 300, 400, 500, 600 image sensor package
110 imaging apparatus
210 housing portion
522 bottom plate portion

What is claimed is:
1. An image sensor package, comprising:
a solid-state image sensor that has a light-receiving surface and a rear surface,
   wherein the light-receiving surface lies in a first plane that faces a first direction and includes a light-reception unit and a first terminal unit,
   wherein the first terminal unit is on the light-receiving surface of the solid-state image sensor,
   wherein the rear surface is opposite to the light-receiving surface, and
   wherein the rear surface faces a second direction;
a transparent substrate placed facing the light-receiving surface and comprising a light-receiving surface that faces the first direction and a rear surface that faces the second direction; and
a package substrate including:
   a frame portion that has a first main surface including a first joint surface that faces the first direction, and a second main surface that faces the second direction,
      wherein the first joint surface lies within a plane that is parallel to the rear surface of the transparent substrate,
      wherein the first joint surface is a surface of the package substrate closest to the light-receiving surface of the transparent substrate, and
      wherein at least a portion of the first joint surface is joined to the rear surface of the transparent substrate;
   a second joint surface that is opposite the first joint surface,
      wherein the second joint surface faces the second direction,
      wherein a first peripheral portion of the light receiving surface outside of an area including the light-reception unit and the first terminal unit and along a first end of the solid-state image sensor is joined to a first portion of the second joint surface,
      wherein a second peripheral portion of the light receiving surface outside of an area including the light-reception unit and the first terminal unit and along a second end of the solid-state image sensor is joined to a second portion of the second joint surface,
      wherein the first terminal unit includes a first portion that extends along a first side of the solid-state image sensor, between Me first anal second peripheral portions, and
      wherein the first terminal unit includes a second portion that extends along a second side of the solid-state image sensor, between the first and second peripheral portions;
   a housing portion housing the solid-state image sensor;
   a second terminal unit,
      wherein the second terminal unit is provided on a terminal arrangement surface in the frame portion,
      wherein the terminal arrangement surface faces the first direction,
      wherein the terminal arrangement surface is between the first main surface and the second main surface of the package substrate,
      wherein the terminal arrangement surface extends along first and second sides of the housing portion, wherein a first portion of the second terminal unit extends along the first side of the housing portion, between the first portion of the second joint surface and the second portion of the second joint surface, and adjacent the first portion of the first terminal unit, Wherein a second portion of the second terminal unit extends along the second side of the housing portion, between the first portion of the second joint surface and the second portion of the second joint surface, and adjacent the second portion of the first terminal unit, and wherein the first terminal unit is coupled to the second terminal unit by bonding wire.

2. The image sensor package according to claim 1, wherein the package substrate further includes a third terminal unit for surface mount, and a second terminal arrangement surface that is opposite to the first terminal arrangement surface and supports the third terminal unit.

3. The image sensor package according to claim 1, wherein a plurality of supporting portions are each provided on a pair of side portions of the frame portion, the pair of side portions being opposed to each other.

4. The image sensor package according to claim 3, wherein the plurality of supporting portions are each provided at four corners of the frame portion.

5. The image sensor package according to claim 4, wherein a cured product layer formed of adhesive resin is provided between four corners of the frame portion and the peripheral portion of the light-receiving surface of the solid-state image sensor.

6. The image sensor package according to claim 5, wherein the plurality of supporting portions further include a plurality of base materials that are bridged between the four corners of the frame portion and the peripheral portion of the light-receiving surface of the solid-state image sensor, and covered by the cured product layer.

7. The image sensor package according to claim 1, wherein the frame portion includes a multilayer ceramic substrate.

8. The image sensor package according to claim 1, wherein the frame portion includes a molded body formed of a plastic material.

9. An imaging apparatus, comprising:

a solid-state image sensor that has a light-receiving surface and a rear surface,
  wherein the light-receiving surface lies in a first plane that faces a first direction and includes a light-reception unit and a first terminal unit,
  wherein the first terminal unit is on the light-receiving surface of the solid-state image sensor,
  wherein the rear surface is opposite to the light-receiving surface, and
  wherein the rear surface faces a second direction;

a transparent substrate placed facing the light-receiving surface and comprising a light-receiving surface that faces the first direction and a rear surface that faces the second direction; and a package substrate including:

a frame portion that has a first main surface including a first joint surface that faces the first direction, and a second main surface that faces the second direction,
  wherein the first joint surface lies within a plane that is parallel to the rear surface of the transparent substrate,
  wherein the first joint surface is a surface of the package substrate closest to the light-receiving surface of the transparent substrate, and
  wherein at least a portion of the first joint surface is joined to the rear surface of the transparent substrate;

a second joint surface that is opposite the first joint surface,
  wherein the second joint surface faces the second direction,
  wherein a first peripheral portion of the light receiving surface outside of an area including the light-reception unit and the first terminal unit and along a first end of the solid-state image sensor is joined to a first portion of the second joint surface,
  wherein a second peripheral portion of the light receiving surface outside of an area including the light-reception unit and the first terminal unit and along a second end of the solid-state image sensor is joined to a second portion of the second joint surface,
  wherein the first terminal unit includes a first portion that extends along a first side of the solid-state image sensor, between the first and second peripheral portions, and
  wherein the first terminal unit includes a second portion that extends along a second side of the solid-state image sensor, between the first and second peripheral portions;

a housing portion housing the solid-state image sensor;

a second terminal unit,
  wherein the second terminal unit is provided on a terminal arrangement surface in the frame portion,
  wherein the terminal arrangement surface faces the first direction,
  wherein the terminal arrangement surface is between the first main surface and the second main surface of the package substrate,
  wherein the terminal arrangement surface extends along first and second sides of the housing portion,
  wherein a first portion of the second terminal unit extends along the first side of the housing portion, between the first portion of the second joint surface and the second portion of the second joint surface, and adjacent the first portion of the first terminal unit,
  wherein a second portion of the second terminal unit extends along the second side of the housing portion, between the first portion of the second joint surface and the second portion of the second joint surface, and adjacent the second portion of the first terminal unit,
  wherein the second terminal unit is between the first piortion of the second joint surface and the second portion of the second joint surface, and
wherein the first terminal unit is coupled to the second terminal unit b bonding wire; and a lens holder including a lens placed facing the light-receiving surface of the solid-state image sensor with the transparent substrate disposed therebetween.

* * * * *